(12) United States Patent
Kai et al.

(10) Patent No.: US 11,171,175 B2
(45) Date of Patent: Nov. 9, 2021

(54) MAGNETIC DEVICE AND MEMORY DEVICE

(71) Applicant: TOSHIBA MEMORY CORPORATION, Tokyo (JP)

(72) Inventors: Tadashi Kai, Yokohama Kanagawa (JP); Masahiko Nakayama, Kuwana Mie (JP); Jyunichi Ozeki, Kuwana Mie (JP); Shogo Itai, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 50 days.

(21) Appl. No.: 16/557,802

(22) Filed: Aug. 30, 2019

(65) Prior Publication Data

US 2020/0302984 A1    Sep. 24, 2020

(30) Foreign Application Priority Data

Mar. 18, 2019    (JP) .............................. JP2019-049587

(51) Int. Cl.
*H01L 27/22* (2006.01)
*H01L 43/08* (2006.01)
(Continued)

(52) U.S. Cl.
CPC .......... *H01L 27/222* (2013.01); *H01L 27/228* (2013.01); *H01L 43/02* (2013.01);
(Continued)

(58) Field of Classification Search
CPC ... H01L 27/10; H01L 27/105; H01L 27/1052; H01L 27/108; H01L 27/10844; H01L 27/112; H01L 27/115; H01L 27/22; H01L 27/222; H01L 27/224; H01L 27/226; H01L 27/228; H01L 27/24; H01L 27/2409; H01L 27/2427; H01L 27/2436; H01L 27/2463; H01L 27/2481; H01L 43/02; H01L 43/04; H01L 43/06; H01L 43/065; H01L 43/08; H01L 43/10; H01L 43/12; H01L 43/14; H01L 48/02; H01L 48/08; G11C 5/063; G11C 11/161
See application file for complete search history.

(56) References Cited

U.S. PATENT DOCUMENTS 5,276,639 A * 1/1994 Inoue ..................... G11C 11/14
                                                          257/31
7,381,480 B2   6/2008 Nakamura et al.
(Continued)

FOREIGN PATENT DOCUMENTS

JP    2009146995 A    7/2009
JP    2019033166 A    2/2019

*Primary Examiner* — Cheung Lee
(74) *Attorney, Agent, or Firm* — Kim & Stewart LLP

(57) ABSTRACT

According to one embodiment, a magnetic device includes a stacked body including a first magnetic layer, a second magnetic layer, and a non-magnetic layer between the first magnetic layer and the second magnetic layer. The stacked body has a quadrangular planar shape, the stacked body has a first side dimension in a first direction parallel to a surface of a substrate and a thickness in a second direction perpendicular to the surface of the substrate, and a ratio of the first side dimension to the thickness is in a range of 0.10 to 4.0.

19 Claims, 17 Drawing Sheets

(51) Int. Cl.
 *H01L 43/02* (2006.01)
 *G11C 11/16* (2006.01)
 *G11C 5/06* (2006.01)
(52) U.S. Cl.
 CPC .............. *H01L 43/08* (2013.01); *G11C 5/063* (2013.01); *G11C 11/161* (2013.01)

(56) References Cited

U.S. PATENT DOCUMENTS

| | | |
|---|---|---|
| 8,803,263 B2 | 8/2014 | Yamada et al. |
| 10,483,459 B2 | 11/2019 | Sugiyama et al. |
| 2015/0249208 A1 | 9/2015 | Yoon et al. |

* cited by examiner

MAGNETIC DEVICE AND MEMORY DEVICE

CROSS-REFERENCE TO RELATED APPLICATION

This application is based upon and claims the benefit of priority from Japanese Patent Application No. 2019-049587, filed Mar. 18, 2019, the entire contents of which are incorporated herein by reference.

FIELD

Embodiments described herein relate generally to a magnetic device and a memory device.

BACKGROUND

Research and development for magnetic memory devices and, more generally, magnetic devices is being conducted to improve characteristics of such devices.

DETAILED DESCRIPTION

Figure 1:
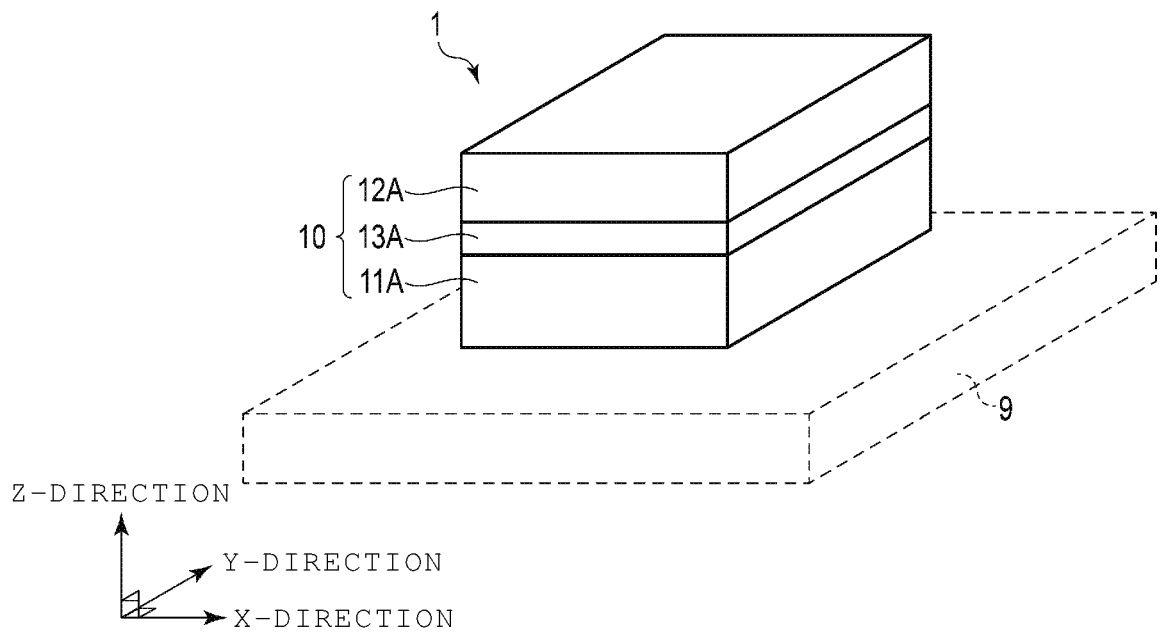
FIG. 1 is a perspective view illustrating a magnetic device according to an embodiment.

In general, according to one embodiment, a magnetic device includes a substrate, and a stacked body including a first magnetic layer, a second magnetic layer, and a non-magnetic layer between the first magnetic layer and the second magnetic layer. The stacked body is on a substrate and has a quadrangular planar shape. The stacked body has a first side dimension in a first direction parallel to a surface of the substrate and a thickness in a second direction orthogonal to the surface of the substrate. The ratio of the first side dimension to the thickness is in a range of 0.10 to 4.0 (endpoints inclusive).

Example embodiments of a magnetic device and a memory device according to the present disclosure will be described with reference to FIGS. 1 to 24.

Hereinafter, various embodiments will be described in with reference to the drawings. In the following description, elements having substantially the same function and configuration are denoted by the same reference numerals or labels.

In following description, elements or aspects occurring in multiple instances, for example, word lines WL, bit lines BL, and various signals may be designated by a common reference numeral or label and each instance may be referred to using the common designation without distinguishing between the various instances. When it is necessary to distinguish between particular instances, a digit/letter for differentiation may be appended at the end of the common reference numeral/label.

In the drawings are schematic, as such the depicted dimensions and dimensional ratio of various elements and/or aspects do not necessarily coincide with the dimension and dimensional ratios in actual devices.

1. First Example

A first example of a magnetic device according to an embodiment will be described with reference to FIGS. 1 to 3.

FIG. 1 is a perspective view illustrating a first example of a magnetic device. FIG. 2 is a top view. FIG. 3 is a cross-sectional view.

Figure 2:
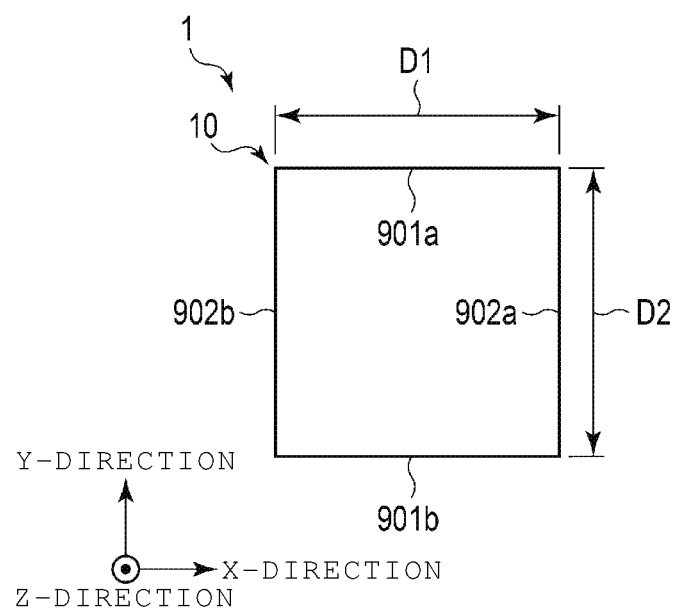
FIG. 2 is a top view illustrating a magnetic device of an embodiment.
Figure 3:
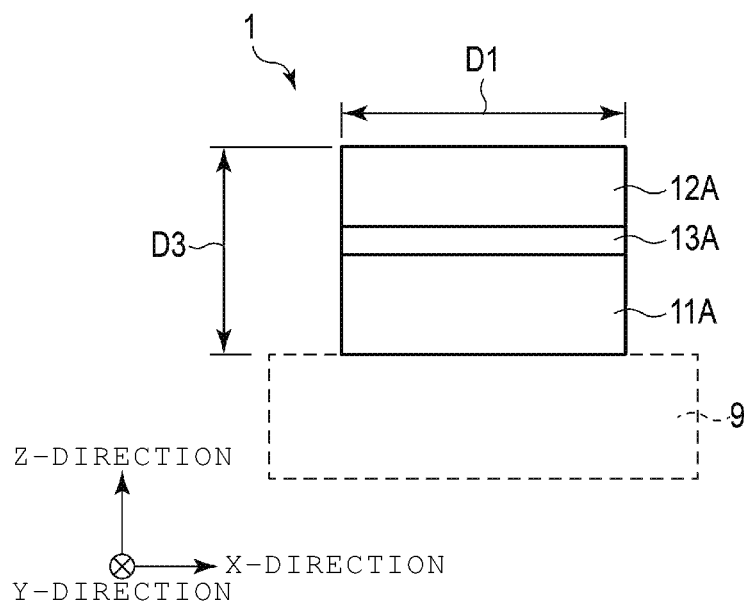
FIG. 3 is a cross-sectional view illustrating a magnetic device of an embodiment.

As illustrated in FIGS. 1 to 3, a magnetic device 1 includes a stacked body 10. The stacked body 10 includes two magnetic layers 11A and 12A and one non-magnetic layer 13A. In this description, layers may also be referred to as "bodies." The non-magnetic layer 13A is provided between the two magnetic layers 11A and 12A. The three layers 11A, 12A, and 13A are stacked in a Z-direction. Each of the layers 11A, 12A, and 13A has a surface substantially parallel to the XY-plane, this surface may be referred to as a layer surface or a film surface. The Z-direction is a direction orthogonal to the XY-plane. The XY-plane is a plane including the X-direction and the Y-direction. The X-direction is, for example, perpendicular to the Y-direction.

The two magnetic layers 11A and 12A are magnetized. Each of the magnetic layers 11A and 12A includes, for example, a plurality of crystal grains. The magnetization of the magnetic layers 11A and 12A consists of the sum of spins of crystal grains or electrons in the layer.

The magnetic device 1 is a magneto-resistance effect element. A magnitude of a resistance value (magneto-resistance) of the stacked body 10 changes in accordance with the relationship of the magnetization alignment states of the magneto-resistance effect element. That is, resistance varies according to the magnetization directions of the two magnetic layers 11A and 12A. For example, each of the magnetic layers 11A and 12A has perpendicular magnetic anisotropy. Each of the magnetic layers 11A and 12A is magnetized in a direction (Z-direction) perpendicular to the layer surface of the magnetic layer. The magnetization directions of the magnetic layers 11A and 12A are substantially parallel to the stacking direction of the magnetic layers 11A and 12A.

In the magneto-resistance effect element 1, a magnetization reversal threshold of one magnetic layer (for example, magnetic layer 12A) is less than the magnetization reversal threshold for the other magnetic layer (for example, magnetic layer 11A).

When changing the magnetization alignment state (which changes the resistance value) of the magneto-resistance effect element 1, energy (such as electric current and/or voltage) equal to or higher than the magnetization reversal threshold of one magnetic layer (e.g., layer 12A) but less than the magnetization reversal threshold of the other magnetic layer (e.g., layer 11A) is supplied to the magneto-resistance effect element 1.

When determining the magnetization alignment state of the magneto-resistance effect element 1, for example, energy less than the magnetization reversal threshold of the one magnetic layer (e.g., layer 12A) and the magnetization reversal threshold of the other magnetic layer (e.g., layer 11A) is supplied to the magneto-resistance effect element 1. The magneto-resistance effect element 1 outputs a current value or voltage value according to the applied energy and the magnetization alignment state of the magneto-resistance effect element 1. Thus, the magnetization alignment state (which corresponds to the resistance value) of the magneto-resistance effect element 1 can be determined without changing the magnetization alignment state of the magneto-resistance effect element 1.

A structure of the stacked body 10 is, for example, a quadrangular pillar. A planar shape (as viewed from the Z-direction) of the stacked body 10 is a rectangular or other quadrangular shape. Here, the depicted cross-sectional shape of the stacked body 10 is a rectangle.

The stacked body 10 has two sides 901a and 901b opposed to each other in the Y-direction and two sides 902a and 902b opposed to each other in the X-direction, in the XY-plane.

Here, at least one of the sides 901a and 901b is parallel to the X-direction. At least one of the sides 901a and 901b has a dimension D1. In the depicted example, sides 901a and 901b both have the dimension D1 in the X-direction and are parallel to the X-direction. However, in other examples the sides 901a and 901b are not necessarily parallel to the X-direction or to each other and one or the other of the two sides 901a and 901b may have a dimension other than dimension D1.

In the depicted example, the sides 902a and 902b are both parallel to the Y-direction and both sides 902a and 902b have the dimension D2 in the Y-direction. However, in other examples the sides 902a and 902b are not necessarily parallel to the Y-direction or to each other and one or the other of the two sides 902a and 902b may have a dimension other than dimension D2.

As noted, the magneto-resistance effect element 1 has a quadrangular planar shape when viewed from the Z-direction. The dimensions D1 and D2 of the magneto-resistance effect element 1 having the quadrangular planar shape are overall dimensions of the sides the stacked body 10 in the XY-plane and each layer thereof; however, in other examples, certain layers in the stacked body 10 may not share the same overall dimensions of the stacked body 10 or the overall shape of the stacked body 10.

The stacked body 10 has a dimension D3 in the Z-direction.

A ratio (D1/D3) of the dimension D1 to the dimension D3 is set to a value within a range of 0.10 to 4.0. In this context, descriptions of a range of values includes the range endpoint values unless otherwise noted.

For example, the dimension D1 is a value within the range of 5 nm to 40 nm. For example, the dimension D2 is a value within the range of 5 nm to 40 nm. For example, the dimension D3 is in the range of 10 nm to 50 nm.

In this first example, in the magneto-resistance effect element 1 with a quadrangular planar shape, it has been found that when the dimensional ratio D1/D3 has a value within the range of 0.10 to 4.0, interoperability and coupling force between the plurality of spins in the magnetic layers 11A and 12A is increased.

As a result, stability of the magnetization of the magnetic layers 11A and 12A and interoperability of the precession of a plurality of spins at the time of the magnetization reversal of the magnetic layers are improved.

2. First Embodiment

A magnetic device according to a first embodiment will be described with reference to FIGS. 4 to 10.

a. Structure Example

A structure example of the magnetic device of this embodiment will be described with reference to FIGS. 4 to 6.

Figure 4:
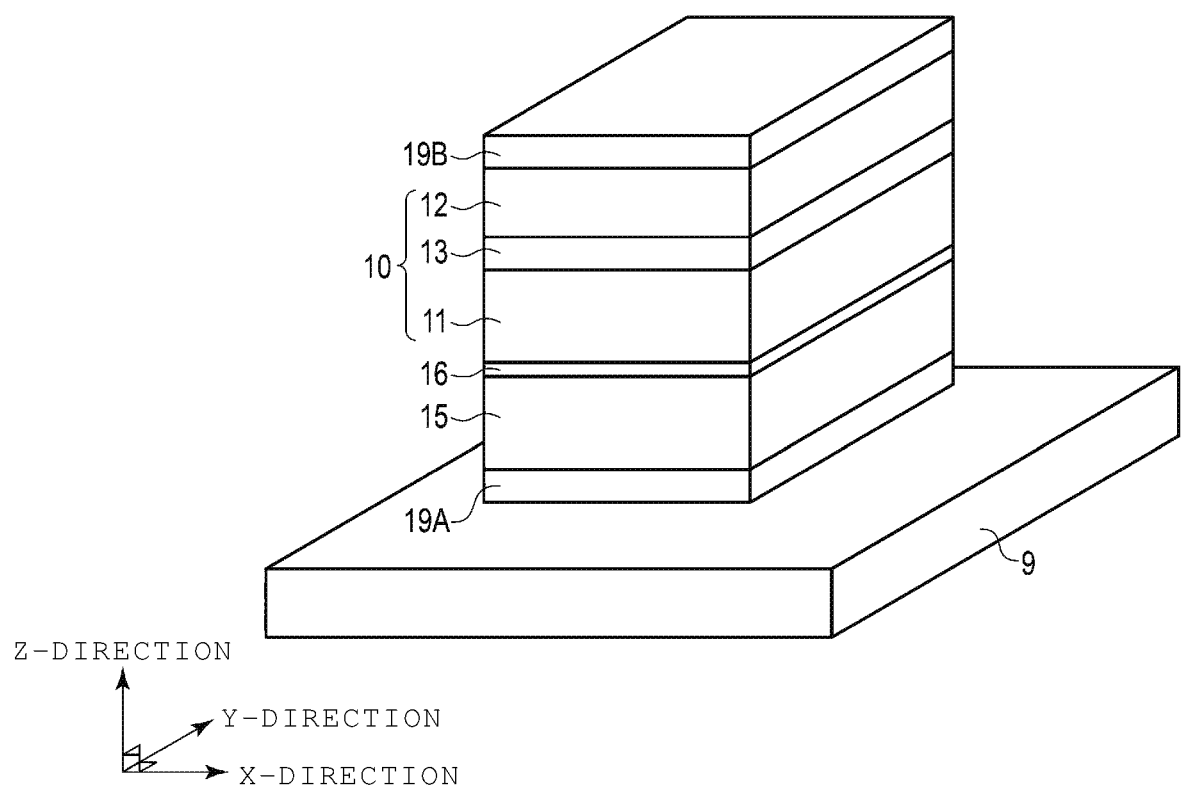
FIG. 4 is a perspective view illustrating a structure example of a magnetic device according to a first embodiment.

FIG. 4 is a perspective view illustrating an example of the structure of the magnetic device of this first embodiment. FIG. 5 is a top view. FIG. 6 is a cross-sectional view.

The magnetic device of this first embodiment is a magneto-resistance effect element.

Figure 5:
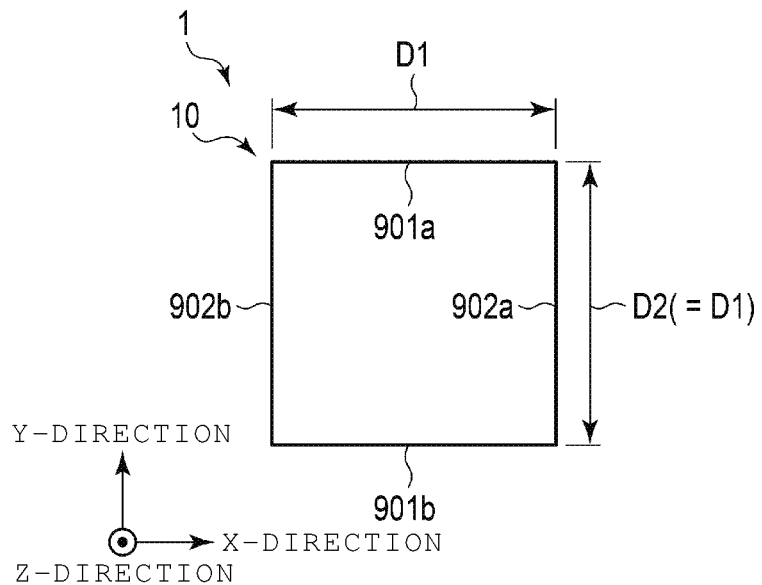
FIG. 5 is a top view illustrating a magnetic device of a first embodiment.
Figure 6:
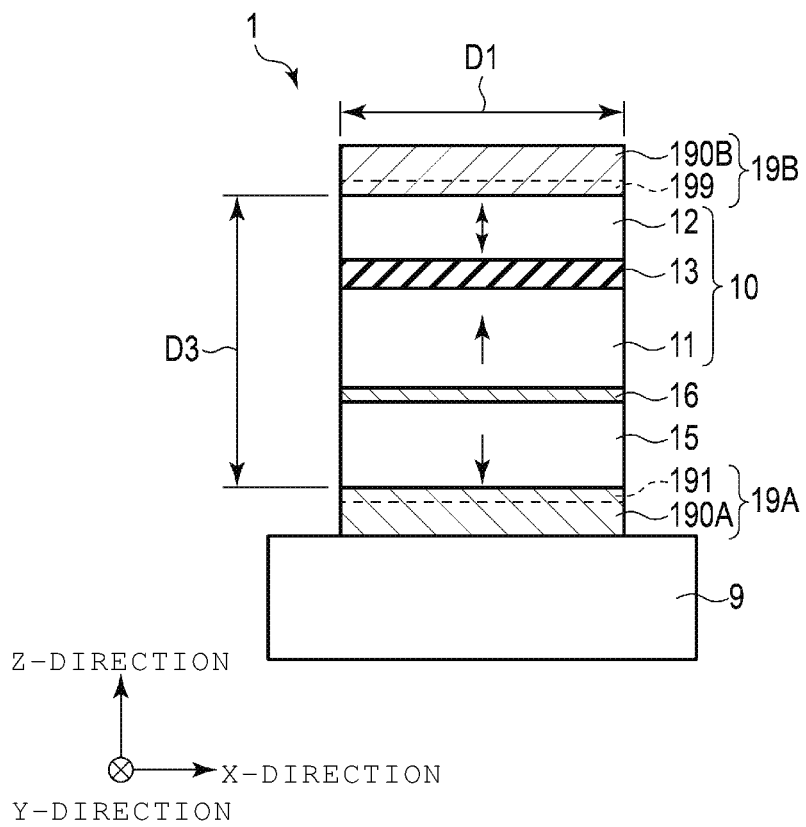
FIG. 6 is a cross-sectional view illustrating a magnetic device of a first embodiment.

As illustrated in FIGS. 4 to 6, the magneto-resistance effect element 1 of this first embodiment includes a stacked body 10.

In this first embodiment, the stacked body 10 includes two magnetic layers 11 and 12 and the non-magnetic layer 13. The non-magnetic layer 13 is provided between the two magnetic layers 11 and 12. The two magnetic layers 11 and 12 and the non-magnetic layer 13 together form a magnetic tunnel junction (MTJ).

A magneto-resistance effect element 1 including a magnetic tunnel junction can be referred to as an MTJ element. The non-magnetic layer 13 is also referred to as a tunnel barrier layer in this context.

Each of the magnetic layers 11 and 12 has perpendicular magnetic anisotropy. A direction of an axis of easy magnetization of each magnetic layer is perpendicular to the film surface of the magnetic layers. Each of the magnetic layers 11 and 12 has a magnetization perpendicular to the film surface of the magnetic layers 11 and 12. The magnetization direction of each of the magnetic layers 11 and 12 is parallel to the stacking direction (Z-direction) of the magnetic layers 11 and 12. The magnetization of a magnetic layer, also referred to as macroscopic magnetization, is the combined result of the set of spins, also referred to as microscopic magnetization, of a plurality of magnetic grains (or the electrons thereof) in the magnetic layer.

The direction of magnetization of the magnetic layer 12 is variable. The direction of magnetization of the magnetic layer 11 is considered invariable or fixed in this context. In the following, a magnetic layer 12 whose magnetization direction is variable is also referred to as a storage layer 12. A magnetic layer 11 whose magnetization direction is invariable (fixed) is also referred to as a reference layer 11. The storage layer 12 may be referred to as a free layer, a magnetization free layer, or a magnetization variable layer. The reference layer 11 may be referred to as a pin layer, a pinned layer, a magnetization invariable layer, or a magnetization fixed layer.

In this disclosure, "the direction of magnetization of the reference layer (magnetic layer) is invariant" or "the direction of magnetization of the reference layer (magnetic layer) is in a fixed state" means that the magnetization direction of the reference layer does not change when the current or voltage for changing the direction of magnetization of a storage layer is supplied to the magneto-resistance effect element.

For example, when the direction of magnetization of the storage layer is switched by spin transfer torque (STT), a write current is supplied to the MTJ element 1.

Depending on whether the write current flows from the storage layer 12 to the reference layer 11 or from the reference layer 11 to the storage layer 12, a change from an anti-parallel (AP_state to a parallel (P) state of the magnetization alignment state of the MTJ element 1 or a change from the P state to the AP state of the magnetization arrangement state of the MTJ element 1 is performed. A current value of the write current is less than the magnetization reversal threshold of the reference layer 11 and is set to the magnetization reversal threshold of the storage layer 12 or greater.

When the magnetization alignment state of the MTJ element 1 is changed from the AP state to the P state, spin torque of electrons having the same direction as the magnetization direction of the reference layer 11 is applied to the magnetization of the storage layer 12. When the magnetization direction of the storage layer 12 is opposite to the magnetization direction of the reference layer 11, the magnetization direction of the storage layer 12 changes in the same direction as the magnetization direction of the reference layer 11, due to the applied spin torque.

As a result, the magnetization alignment state of the MTJ element 1 is set to the P state.

When the spin torque of electrons having the same direction as the magnetization direction of the reference layer 11 is applied to the storage layer 12 of the MTJ element 1 in the P state, the magnetization direction of the storage layer 12 does not change. Accordingly, the MTJ element 1 maintains the P state.

When the magnetization alignment state of the MTJ element 1 is changed from the P state to the AP state, the spin torque of electrons in the direction opposite to the magnetization direction of the reference layer 11 is applied to the magnetization of the storage layer 12. When the magnetization direction of the storage layer 12 is the same as the magnetization direction of the reference layer 11, the magnetization direction of the storage layer 12 changes in the direction opposite to the magnetization direction of the reference layer 11, due to the applied spin torque.

As a result, the magnetization alignment state of the MTJ element 1 is set to the AP state.

When the spin torque of electrons in the direction opposite to the magnetization direction of the reference layer 11 is applied to the storage layer 12 of the MTJ element 1 in the AP state, the magnetization direction of the storage layer 12 does not change. Accordingly, the MTJ element 1 maintains the AP state.

As described above, when the magnetization alignment state (which corresponds to the resistance value) of the MTJ element 1 is determined, a read current is supplied to the MTJ element 1. A current value of the read current is set to a value less than the magnetization reversal threshold value of the storage layer 12. Based on the magnitude of a current value or voltage value from the MTJ element 1 to which the read current has been supplied, the resistance value (or magnetization alignment state) of the MTJ element 1 is determined.

In the MTJ element 1 of this first embodiment, the stacked body 10 is provided between two electrodes 19A and 19B in the Z-direction. The electrodes 19A and 19B include conductive layers 190A and 190B, respectively. The conductive layers 190A and 190B may be metal layers. Here, the electrode 19A can be referred to as a lower electrode, and the other electrode 19B can be referred to as an upper electrode.

In this first embodiment, a shift cancellation layer 15 is provided in the MTJ element 1. The shift cancellation layer 15 is provided between the reference layer 11 and the electrode 19A. The shift cancellation layer 15 is a magnetic layer for reducing the influence of a leakage magnetic field of the reference layer 11.

A non-magnetic layer 16 is provided between the shift cancellation layer 15 and the reference layer 11. The non-magnetic layer 16 is, for example, a metal layer such as a ruthenium (Ru) layer.

The reference layer 11 is anti-ferromagnetically coupled to the shift cancellation layer 15 via the non-magnetic layer 16. The stacked body 10 including the reference layer 11, the non-magnetic layer 16, and the shift cancellation layer 15 forms a synthetic antiferromagnetic (SAF) structure.

In the SAF structure, the magnetization direction of the shift cancellation layer 15 is opposite to the magnetization direction of the reference layer 11. By the SAF structure, the magnetization direction of the reference layer 11 is set to a fixed state.

The lower electrode 19A in this example includes an underlayer 191. The underlayer 191 is provided between a magnetic layer (here, the shift cancellation layer) 15 and a conductive layer (here, conductive layer 190A). The underlayer 191 is at least one of a metal layer, boride layer, nitride layer, or the like. The underlayer 191 is a layer used for improving the characteristics, for example, crystallinity and/or magnetic properties, of the magnetic layer 15 in contact with the underlayer 191.

The upper electrode 19B in this example includes a cap layer 199. The cap layer 199 is a non-magnetic layer of conductive material between a magnetic layer (here, the storage layer 12) and a conductive layer (here the conductive layer 190B). The cap layer 199 is a layer used for improving the characteristics, for example, crystallinity and/or magnetic properties, of the magnetic layer 12 in contact with the cap layer 199.

In this first embodiment, the stacked body 10 of the MTJ element 1 includes a magnetic layer 15 and a non-magnetic layer 16, which provide the SAF structure, in addition to the two magnetic layers 11 and 12 and the tunnel barrier layer 13. The stacked body 10 has a height of dimension D3 in the Z-direction.

While as described, the underlayer 191 and the cap layer 199 are portions, respectively, of the lower electrode 19A and the upper electrode 19B, either or both of the underlayer 191 and the cap layer 199 may be or be considered to be an integral component of the stacked body 10 depending on particular device arrangements and manufacturing processes utilized. Likewise, either or both of the lower electrode 19A and the upper electrode 19B may be regarded as an integral component of the stacked body 10 depending on particular device arrangements and manufacturing processes utilized.

As illustrated in FIG. 5, the MTJ element 1 of this first embodiment has, for example, a square planar shape.

In the MTJ element having a square planar shape, the sides 901a and 901b along the X-direction each have a dimension D1. The sides 902a, 902b along the Y-direction each have a dimension D2. The dimension D2 is substantially equal to the dimension D1 in this example.

The dimension D3 of the MTJ element 1 in the Z-direction corresponds to the height of the stacked body 10 between the upper surface of the lower electrode 19A and the bottom surface of the upper electrode 19B. Here, the upper surface of the lower electrode 19A corresponds to an interface between the shift cancel layer 15 and the lower electrode 19A. Here, the bottom surface of the upper electrode 19B corresponds to an interface between the storage layer 12 and the upper electrode 19B.

In the MTJ element of this first embodiment, a ratio D1/D3 has a value of 0.10 or more and 4.0 or less.

For example, in the square planar shape of the MTJ element 1, the dimension D1 has a value in the range of about 5 nm to about 40 nm. The dimension D2 is substantially equal to dimension D1 in this example. The dimension D1 is more preferably in a range of about 14 nm to about 25 nm. As an example, the dimensional ratio D1/D3 may take a value within the range of 0.28 to 2.5.

The dimension D3 in this example has a value in the range of about 10 nm to about 50 nm.

As in this first embodiment, the dimension along a diagonal of the rectangular planar shape is the maximum dimension of the MTJ element 1 in the XY-plane. For example, when the planar shape of the MTJ element is a square, the maximum dimension of the MTJ element 1 in the XY-plane is $\sqrt{2} \times D1$.

Figure 7:
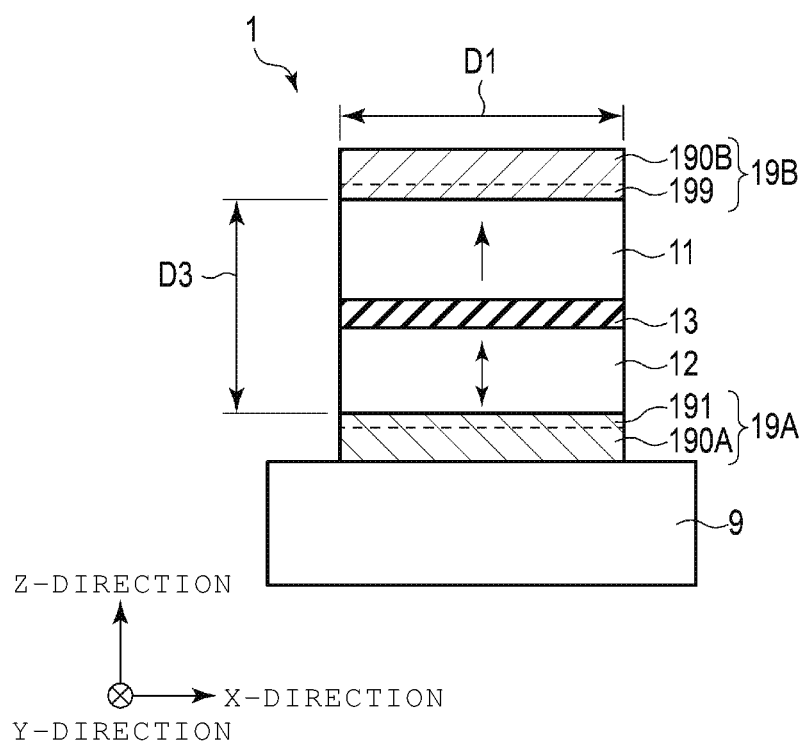
FIG. 7 is a cross-sectional view illustrating another magnetic device according to a first embodiment.

FIG. 7 is a cross-sectional view illustrating a modification of the MTJ element of this first embodiment.

As illustrated in FIG. 7, the storage layer 12 may be provided on the lower electrode 19A side, and the reference layer 11 may be provided on the upper electrode 19B side.

A shift cancellation layer (15) and the metal layer (16) are optionally not provided in this modification. In this case, the reference layer 11 is in contact with the upper electrode 19B.

However, a metal layer (16) for the SAF structure and a shift cancellation layer (15) may be provided between the reference layer 11 and the upper electrode 19B in some examples.

b. Characteristics

The characteristics of the MTJ element according to this first embodiment will be described with reference to FIGS. 8 to 10.

Figure 8:
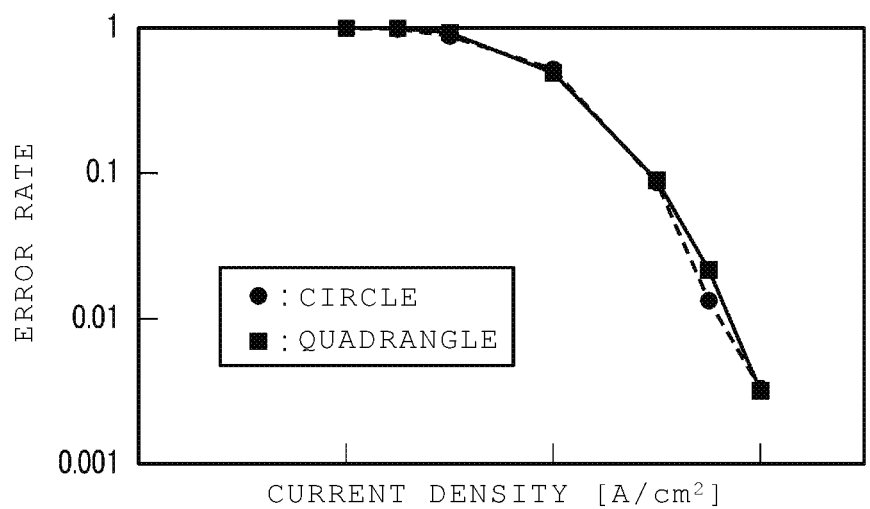
FIG. 8 is a graph illustrating a characteristic of a magnetic device of an embodiment.

FIG. 8 is a graph for illustrating a write error rate of the MTJ element of this first embodiment.

In FIG. 8, the horizontal axis is current density of the write current, and the vertical axis is the probability of occurrence of a write error (hereinafter, referred to as a write error rate). The write error rate corresponds to the probability that an intended magnetization reversal of the storage layer of the MTJ element does not occur during the supplying of the write current. In FIG. 8, the square ("quadrangle") points in the graph corresponds to the write error rate for a MTJ element of this first embodiment, and the filled circle points in the graph corresponds to the write error rate for an MTJ element having a circular planar shape as a comparative example.

The MTJ element of this first embodiment has a dimensional ratio D1/D3 of a value of 0.10 to 4.0. In the MTJ element of the comparative example, a ratio of a diameter of the circle to the dimension in the Z-direction is set to a value of 0.10 or more and 4.0 or less. The length of a side in the XY-plane of the MTJ element of this first embodiment is set to 25 nm or less. The diameter in the XY-plane of the MTJ element of the comparative example is set to 25 nm or less.

As illustrated in FIG. 8, as the current density of the write current increases, the write error rate of the MTJ elements decreases.

The write error rate of the MTJ element of the first embodiment shows substantially the same tendency as the write error rate of the comparative example with respect to the write current.

Thus, unexpectedly, when the planar shape of the MTJ element is set as a quadrangle, if the dimension D1 of the side of the quadrangle and the dimensional ratio D1/D3 are values within the ranges described above, the magnetization switching of the storage layer in the MTJ element occurs at with current density of substantially the same magnitude as the write current density required for the MTJ element of the comparative example with about the same error rate despite having substantially different geometric shapes.

For the MTJ element 1 having a quadrangular planar shape according to the first embodiment, the characteristics regarding a write operation (magnetization switching) unexpectedly do not deviate substantially from the circular planar shape comparative example.

Figure 9:
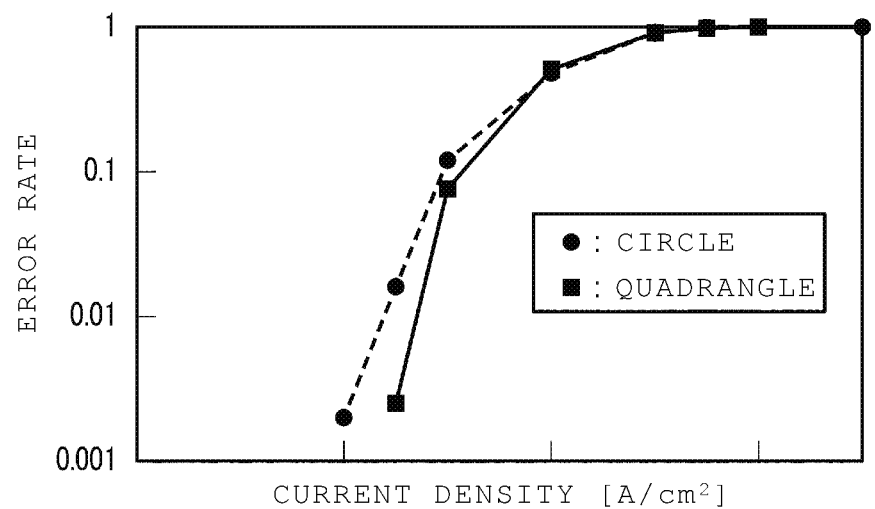
FIG. 9 is a graph illustrating another characteristic of a magnetic device of an embodiment.

FIG. 9 is a graph for illustrating a read error rate of the MTJ element of this first embodiment.

In FIG. 9, the horizontal axis corresponds to a read current supplied to the MTJ element, and the vertical axis corresponds to read error rate. The read error rate corresponds to the probability that an unintended magnetization reversal of the storage layer of an MTJ element occurs during the supplying of a read current. In FIG. 9, the square ("quadrangle") points are for the MTJ element of this first embodiment, and the filled circle points are for a circular planar MTJ element (i.e., the comparative example).

The dimensions for MTJ element of this first embodiment and the comparative example are as explained above in conjunction with FIG. 8.

As illustrated in FIG. 9, as the read current decreases, unexpectedly the read error rate of the MTJ element of this first embodiment becomes lower sooner (at a higher current density) than the read error rate of the comparative example.

This indicates that when the same read error rate is to be achieved in this first embodiment and the comparative example, the read current used in this first embodiment can be larger than the read current used in the comparative example. In this case, the output signal from the MTJ element 1 can be increased as compared to the comparative example for the same error rate, and accuracy in determining (reading) the data stored in the MTJ element 1 can be improved.

As such, the MTJ element of this first embodiment can improve the reliability of a read operation by making it easier to determine of the resistance value of the MTJ element.

Figure 10:
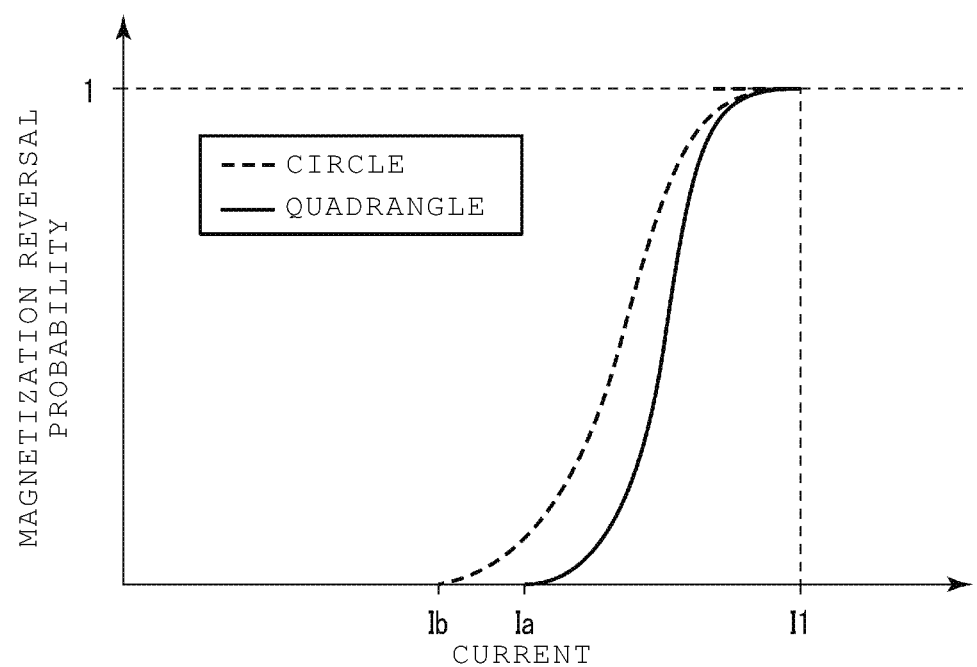
FIG. 10 is a graph illustrating still another characteristic of a magnetic device of an embodiment.

FIG. 10 is a graph illustrating a magnetization reversal probability with respect to the current in the MTJ element of this first embodiment.

In FIG. 10, the horizontal axis corresponds to the current supplied to the MTJ element, and the vertical corresponds to the magnetization reversal probability of the storage layer of the MTJ element during the supply of current. In FIG. 10, the solid line corresponds to the magnetization reversal probability of the MTJ element of this first embodiment, and the dashed line corresponds to the magnetization reversal probability of the MTJ element of the comparative example (with a circular planar shape).

The dimensions of the MTJ element of the first embodiment and the comparative example are again as described above in conjunction with FIG. 8.

The current value of the write current is set to a value I1 based on a designed magnetization reversal threshold of the storage layer.

The read current is desirably set to a value equal to or less than the value at which the increase in the magnetization reversal probability occurs.

As illustrated in FIG. 10, at the current value Ia the magnetization reversal probability starting to increase for the MTJ element of this first embodiment. The current value Ia is higher than the corresponding current value Ib for the MTJ element of the comparative example.

In the MTJ element according to this first embodiment, the magnetization reversal of the storage layer occurs less at current values lower than the magnetization reversal threshold value I1 as compared to the MTJ element of the comparative example.

Accordingly, as described in FIG. 9 described above, the MTJ element of this first embodiment can have an increased read current as compared with the MTJ element of the comparative example.

The MTJ element of this first embodiment can thus improve reliability of the read operation without deterioration of the characteristics of the write operation.

c. Summary

The magneto-resistance effect element of the present embodiment has a quadrangular planar shape.

When the planar shape of the MTJ element of this present embodiment is a square, the ratio of the dimension of a side of the square to the height of the MTJ element in the Z direction is set to 0.10 or more and 4.0 or less.

For example, in the MTJ element of this present embodiment having the square planar shape, the length of a side of the square is set within a range of 5 nm to 40 nm. More preferably, a side of the square is set within a range of 14 nm to 25 nm.

In the magneto-resistance effect element of this present embodiment, the magnetic layer functioning as the storage layer has improved stability of magnetization with respect to the read current in comparison to the comparative example while surprisingly maintaining nearly the same magnetization reversal response with respect to the write current as the comparative example.

As a result, the magneto-resistance effect element of this present embodiment can have improved reliability as compared to the comparative example.

3. Second Embodiment

Figure 11:
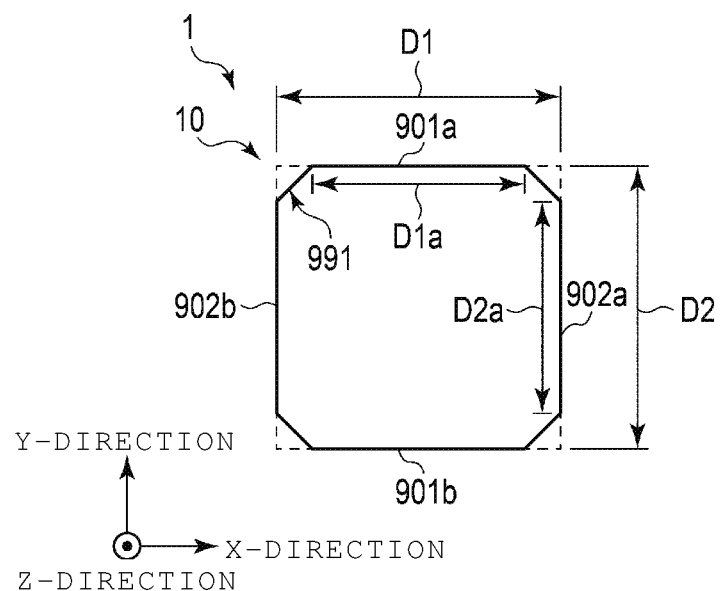
FIG. 11 is a top view illustrating a magnetic device according to a second embodiment.
Figure 12:
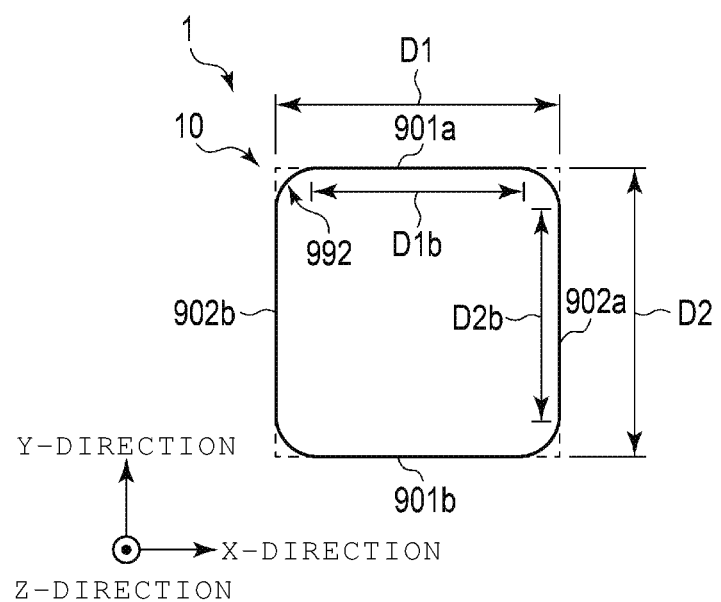
FIG. 12 is a top view illustrating another magnetic device according to a second embodiment.

With reference to FIGS. 11 and 12, a magnetic device according to a second embodiment will be described.

FIGS. 11 and 12 are top views illustrating a planar structure of a magneto-resistance effect element of this second embodiment. A cross-sectional structure of the magneto-resistance effect element of this second embodiment is substantially the same as that depicted in FIG. 6 (or alternatively FIG. 3 or FIG. 7). For that reason, further description of the cross-sectional structure of the magneto-resistance effect element of this second embodiment is omitted.

As illustrated in FIG. 11, in the MTJ element 1 of this second embodiment, at least one corner 991 of the otherwise square planar shape are missing/removed (depicted as dash line in FIG. 11).

In the MTJ element 1 of FIG. 11, an example in which all four corners are removed (chamfered) is depicted, but examples are not limited to this and one to three of the four corners of the MTJ element 1 may be missing.

When the corners of the MTJ element 1 are missing, a dimension D1a of the side 901a along the X-direction of the MTJ element 1 is smaller than the maximum dimension D1 in the X-direction. For example, the dimension D1 corresponds to a distance between two sides 902a, 902b opposed to each other in the X-direction in the vicinity of the central portion in the plane of the MTJ element 1.

When the corners in the planar shape of the MTJ element 1 are missing, a dimension D2a of the side 902a along the Y-direction of the MTJ element is smaller than the maximum dimension D2 in the Y-direction. For example, the dimension D2 corresponds to a distance between two sides 901a, 901b opposed to each other in the Y-direction in the vicinity of the central portion in the planar shape of the MTJ element 1.

As illustrated in FIG. 12, the MTJ element 1 of this second embodiment may have a shape in which one or more corners 992 are rounded.

In the case of having the structure of FIG. 11 or 12, a ratio D1a/D3 is in range of 0.10 to 4.0. In another example, the dimensional ratio D1a/D3 may take a value within a range of 0.28 to 2.5.

Since the dimension D1 is 5 nm to 40 nm, the lower limit value of the dimension D1a is a value less than 5 nm (for example, 4 nm), and the upper limit value of the dimension D1a is a value less than 40 nm. Similarly, the dimension D2a is less than 40 nm. The dimension D1a and/or the dimension D2a may be set to a value of 4 nm to 40 nm.

When the MTJ element has a dimensional ratio D1a/D3 in the range of approximately 0.10 to 4.0, and has a planar shape similar to a quadrangle other than respect to corner portions, the characteristics similar to those illustrated in FIGS. 8 to 10 can still be obtained.

Accordingly, the magnetic device of this second embodiment can obtain substantially the same effect as the magnetic device of the first embodiment.

4. Third Embodiment

Figure 13:
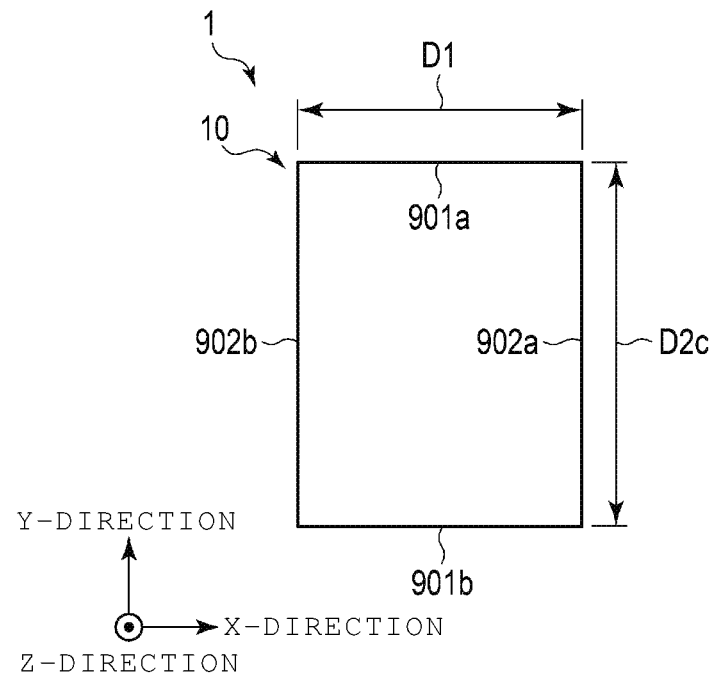
FIG. 13 is a top view illustrating a magnetic device according to a third embodiment.
Figure 14:
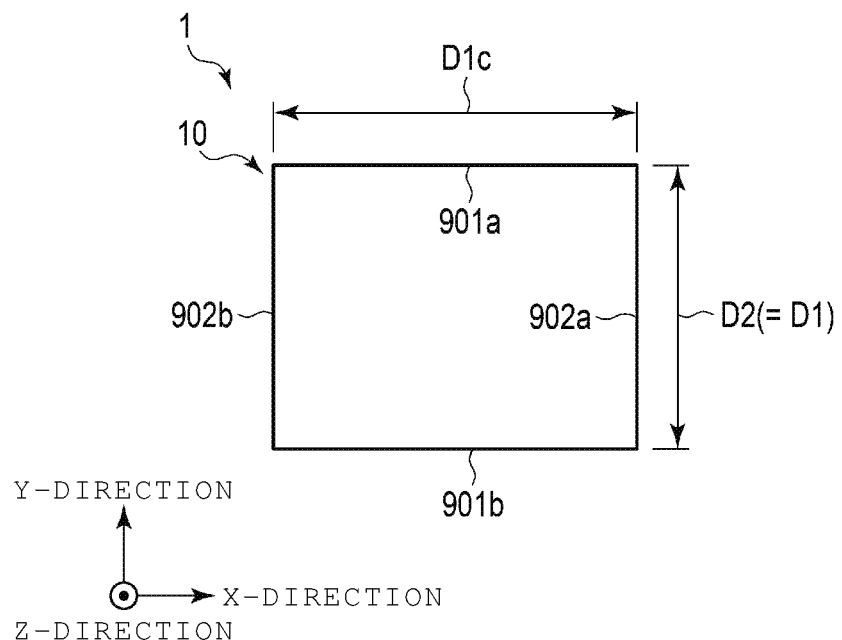
FIG. 14 is a top view illustrating another magnetic device according to a third embodiment.

With reference to FIGS. 13 and 14, a magneto-resistance effect element according to a third embodiment will be described.

FIGS. 13 and 14 are top views illustrating a planar structure of the magneto-resistance effect element of this third embodiment.

As illustrated in FIGS. 13 and 14, in the MTJ element of this third embodiment, the dimension D1 of the side 901a along the X-direction is different from a dimension D2c of the side 902a along the Y direction.

In this third embodiment, the planar shape of the magneto-resistance effect element is a rectangular shape.

In the example of FIG. 13, the sides 901a, 901b parallel to the X-direction corresponds to the short sides and the sides 902a, 902b parallel to the Y-direction corresponds to the long side.

The dimension D1 is 5 nm or more and 40 nm or less. In this example, the dimension D2c is longer than the dimension D1.

As in the example of FIG. 14, a dimension D1c of the sides 901a, 901b parallel to the X-direction is longer than the dimension D2 of the sides 902a, 902b parallel to the Y-direction. In this example, the dimension D2 of the short sides of the rectangle along the Y-direction is 5 nm to 40 nm.

The dimension D1c of the long sides of the rectangular planar shape is preferably with a range of 5 nm to 40 nm. In some examples, an MTJ element having a rectangular planar shape may have a short side dimension that is 5 nm or less.

In this third embodiment, the ratio of the dimension D2 to the dimension D1c is greater than 1 and equal to or less than 8.

In the case of having the structure of FIG. 13 or 14, a ratio D1c/D3 or dimensional ratio D2c/D3 is in a range of 0.10 to 4.0. As an example, the dimensional ratio D1c/D3 may take a value of 0.28 to 2.5.

In some examples, the lengths of two opposing sides may be different, for example the MTJ element may have a trapezoidal shape as the quadrangular shape. Similarly, two opposing sides may not be parallel to each other.

As in this third embodiment, if the ratio of the dimension of the short side of the planar rectangular shape to the height dimension D3 of the MTJ element is in the range of about 0.10 to 4.0, characteristics substantially the same as those depicted in FIGS. 8 to 10 can be obtained.

Accordingly, the magnetic device of this third embodiment can obtain substantially the same effect as the magnetic device of the first embodiment.

5. Application Example

With reference to FIGS. 15 to 25, an application example of the magnetic device according to the present disclosure will be described.

5a. Configuration Example

Figure 15:
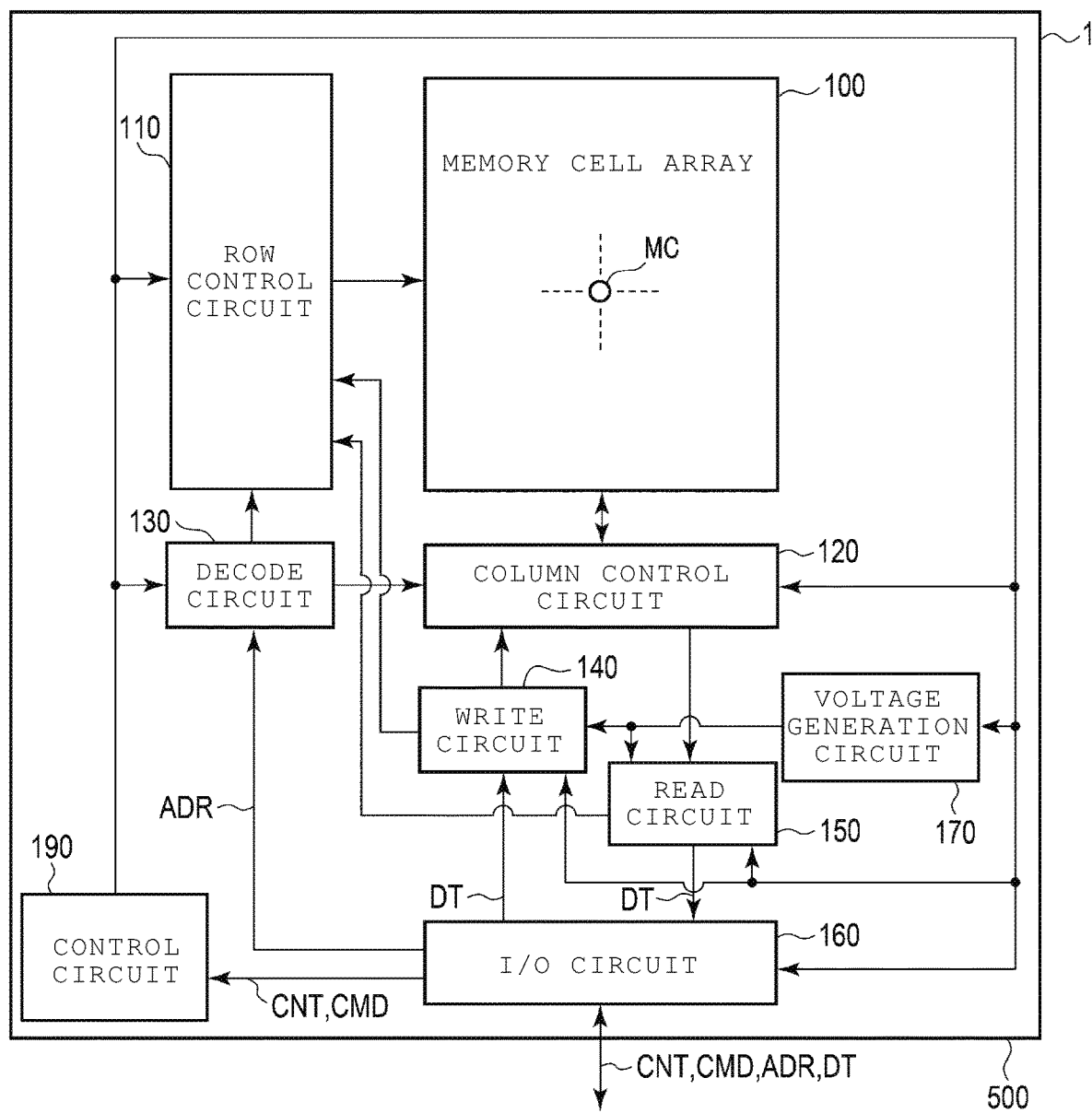
FIG. 15 depicts aspects of an example application of a magnetic device of an embodiment.

FIG. 15 is a block diagram illustrating a configuration example of a device including the magneto-resistance effect element.

For example, the magneto-resistance effect element is an MTJ element according to one or more of the embodiments and examples explained above and is applied to a memory device.

As illustrated in FIG. 15, a memory device 500 of this example includes a memory cell array 100, a row control circuit 110, a column control circuit 120, a decode circuit 130, a write circuit 140, a read circuit 150, an I/O circuit 160, and a voltage generation circuit 170, and a control circuit 190.

The memory cell array 100 includes a plurality of memory cells MC. Each memory cell MC includes a MTJ element 1.

The row control circuit 110 controls a plurality of rows of the memory cell array 100. The row address of an address decoded by the decode circuit 130 is supplied to the row control circuit 110. The row control circuit 110 sets a row (for example, a word line) based on the decoded result of the address to a selected state. In the following, the row (or word line) which is set to the selected state is referred to as a selected row (or selected word line). Rows other than the selected row(s) are called non-selected rows (or non-selected word lines).

The column control circuit 120 controls a plurality of columns of the memory cell array 100. The column address of the address decoded by the decode circuit 130 is supplied to the column control circuit 120. The column control circuit 120 sets a column (for example, a bit line) based on the decoded result of the address to the selected state. In the following, a column (or bit line) which is set to the selected state is referred to as a selected column (or selected bit line). Columns other than the selected column(s) are called non-selected columns (or non-selected bit lines).

The decode circuit 130 decodes an address ADR received from I/O circuit 160. The decode circuit 130 supplies the decoded result of the address ADR to the row control circuit 110 and the column control circuit 120. The address ADR is for example a physical address and includes a selected column address and a selected row address.

The write circuit 140 performs various controls for a write operation (data write). The write circuit may also be referred to as a write control circuit 140 or a write driver 140. The write circuit 140 writes data to the memory cells by supplying a write current to the memory cells via the word lines and the bit lines in a write operation.

For example, the write circuit 140 includes a voltage or current source, a latch circuit, and the like.

The read circuit 150 performs various controls for a read operation (data read). The read circuit 150 is also referred to as a read control circuit 150 or a read driver 150. The read circuit 150 reads data in the memory cells by sensing the potential or the current value on the bit lines BL in a read operation.

For example, the read circuit 150 includes a voltage or current source, a latch circuit, a sense amplifier circuit, and the like.

The write circuit 140 and the read circuit 150 are not required to be circuits independent of each other. For example, the write circuit and the read circuit may utilize mutually available common components and may be provided in the memory device as an integrated circuit.

The input and output (I/O) 160 is an interface circuit for transmitting and receiving various signals in the memory device 500.

The I/O circuit 160 transfers data DT from an external device (for example, a memory controller) to the write circuit 140 as write data for the write operation. The I/O circuit 160 transfers the data DT, which is output from the memory cell array 100 to the read circuit 150, to an external device as read data, in the read operation.

The I/O circuit 160 transfers the address ADR from the external device to the decode circuit 130. The I/O circuit 160 transfers a command CMD from the external device to the control circuit 190. The I/O circuit 160 transmits and receives various control signals CNT between the control circuit 190 and the external device.

The voltage generation circuit 170 generates voltages for various operations of the memory cell array 100 using a power supply voltage provided from the external device. For example, the voltage generation circuit 170 outputs various voltages generated for the write operation to the write circuit 140 during the write operation. The voltage generation circuit 170 outputs various voltages generated for the read operation to the read circuit 150 during the read operation.

The control circuit 190 controls the operation of each circuit in the memory device 500 based on a control signal CNT and the command CMD. The control circuit 190 may also be called a state machine 150, a sequencer 150, or an internal controller 150.

The command CMD may be a signal indicating an operation that is to be executed by the memory device 500. The control signal CNT may be a signal for controlling the operation timing between the external device and the memory device 500 and the operation timing inside the memory device 500.

Figure 16:
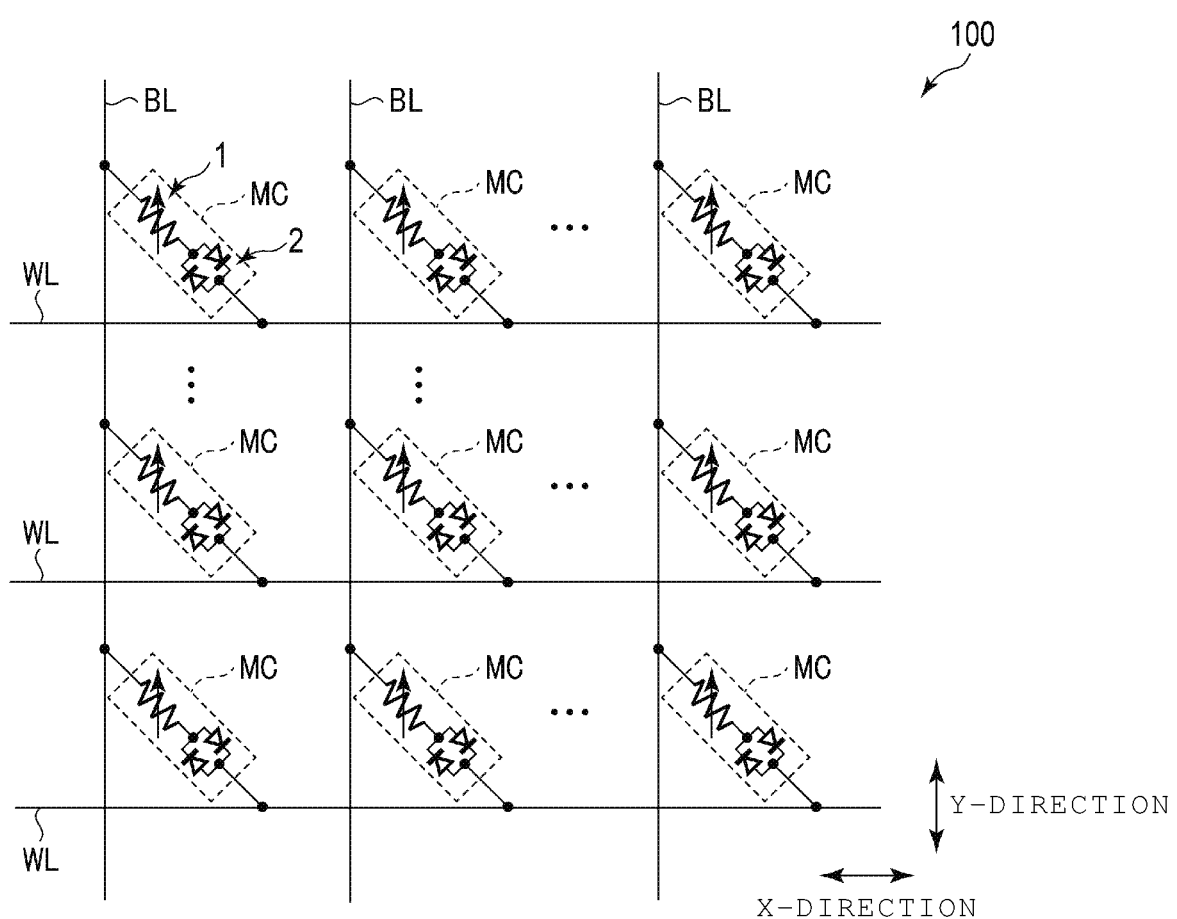
FIG. 16 depicts aspects of another example application of a magnetic device of an embodiment.

FIG. 16 is an equivalent circuit diagram illustrating an example of a configuration of the memory cell array of the memory device.

The memory device 500 includes, for example, the memory cell array 100.

As illustrated in FIG. 16, in the memory cell array 100, a plurality of word lines WL are arranged in the Y-direction. Each word line WL extends in the X-direction. In memory cell array 100, the plurality of bit lines BL are arranged in the X-direction. Each bit line BL extends in the Y-direction.

The memory cells MC are arranged at each intersection of a bit line BL and a word line WL. One end of the memory cell MC is connected to the bit line BL, and the other end of the memory cell MC is connected to the word line WL.

A plurality of memory cells MC arranged in the X-direction are commonly connected to one word line WL. A plurality of memory cells MC arranged in the Y-direction are commonly connected to one bit line BL.

When the memory device is an MRAM, each memory cell MC includes one MTJ element 1 and one switching element 2. In the MRAM, the MTJ element 1 functions as a memory element of the memory cell MC. The switching element 2 switches ON/OFF of memory cell MC.

One end of the MTJ element 1 is connected to the bit line BL, and the other end of the MTJ element 1 is connected to the word line WL via the switching element 2.

The switching element 2 is an element capable of causing the current to flow in the memory cell MC when a voltage equal to or higher than a threshold voltage of the switching element 2 is applied to the memory cell MC. The switching element 2 when in an ON state (low resistance state or conduction state) supplies the current flowing from the bit line side toward the word line side or a current flowing from the word line side toward the bit line side according to a potential difference between the bit line and the word line to the MTJ element 1.

When a voltage less than the threshold voltage of switching element 2 is applied to memory cell MC, the switching element 2 is in an OFF state (high resistance state or non-conduction state). Thus, the supply of current to the MTJ element 1 is cut off.

The operation of an MRAM including the MTJ element 1 can appropriately apply known data write operations (for example, writing data using a magnetic field writing method, STT method and/or spin orbit torque (SOT)) method, and the like) and known data read operations (for example, reading data using DC method, reference cell method, and/or self-reference method, and the like). Accordingly, in this present disclosure, the description of the operation of an MRAM including an MTJ element 1 of the examples and embodiments is omitted.

Figure 17:
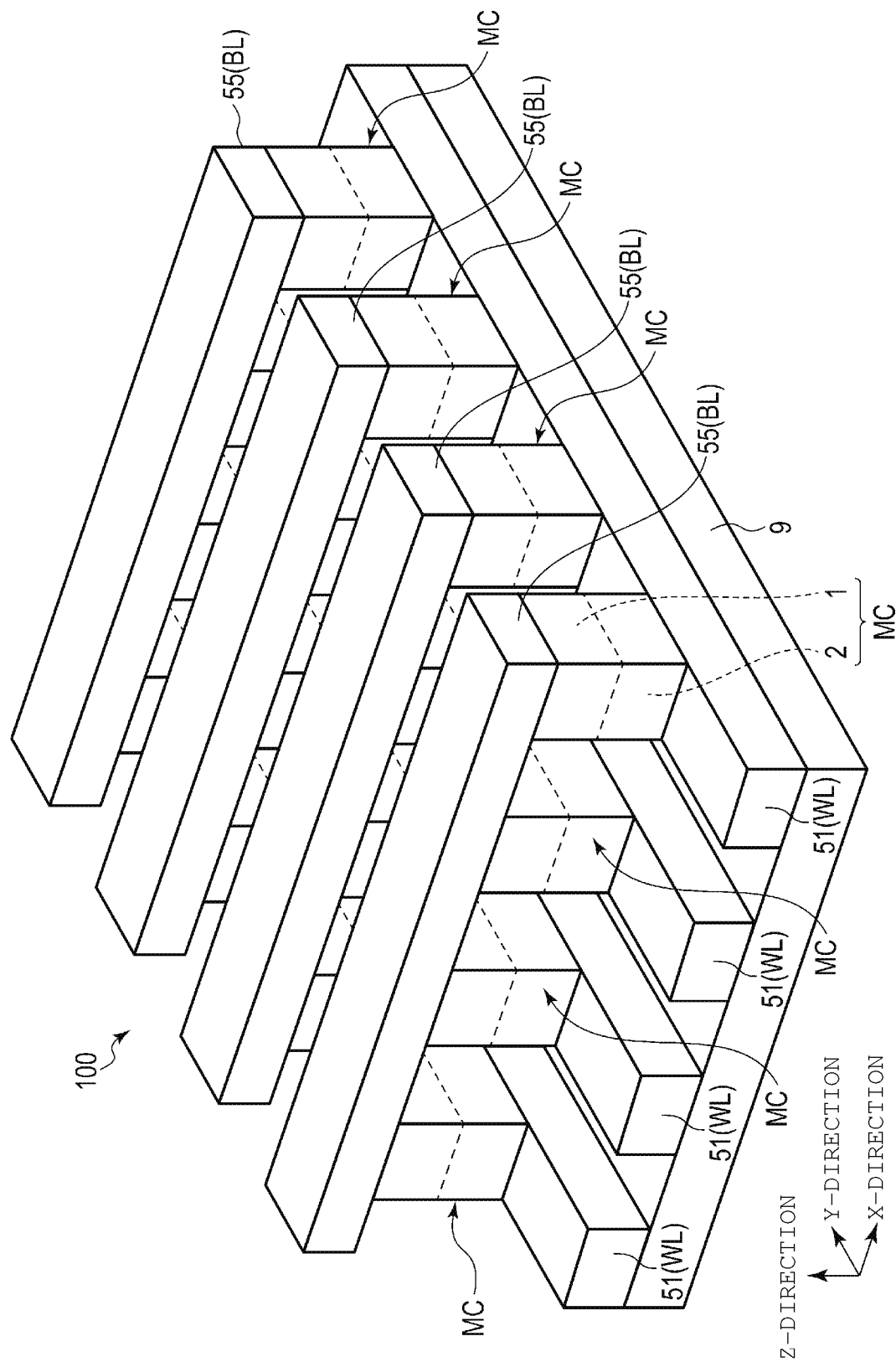
FIG. 17 depicts aspects of still another example application of a magnetic device of an embodiment.

FIG. 17 is a perspective view illustrating a structure example of a memory cell array having memory cells MC between word lines WL and bit lines BL provided at different heights in the Z-direction of the MRAM.

As illustrated in FIG. 17, the memory cell array 100 includes a plurality of wirings 51, a plurality of memory cells MC, and a plurality of wirings 55.

The wiring 51 extends in the X-direction. The plurality of wirings 51 are arranged in the Y-direction.

The wiring 55 extends in the Y-direction. The plurality of wirings 55 are arranged in the X-direction. The wiring 55 is provided above the wiring 51 in the Z-direction.

One of the wiring 51 or the wiring 55 is a word line, and the other of wiring 51 or wiring 55 is a bit line. In the example of FIG. 17, the wiring 51 is the word line WL, and the wiring 55 is the bit line BL.

The plurality of memory cells MC are two-dimensionally arranged in the XY-plane of the memory cell array 100.

A memory cell MC is provided between a wiring 51 and a wiring 55. The memory cell MC is provided on the wiring 51. The wiring 55 is provided on the memory cell MC.

In the memory cell MC of FIG. 17, the switching element 2 is provided on the word line WL side, and the MTJ element 1 is provided on the bit line BL side. The MTJ element 1 is provided on the switching element 2 in the Z-direction.

The structure of the memory cell array 100 is not limited to the example of FIG. 17.

For example, in the memory cell array 100, the memory cells MC may be provided at multiple levels in the Z-direction. In this case, the memory cells MC adjacent in the Z-direction share the wiring 55 (or the wiring 51). For example, in the memory cells MC adjacent in the Z-direction, an arrangement order of the MTJ elements 1 and the switching elements 2 in the Z-direction is preferably set so as to be a mirror image relationship centering on the shared wiring 55.

Figure 18:
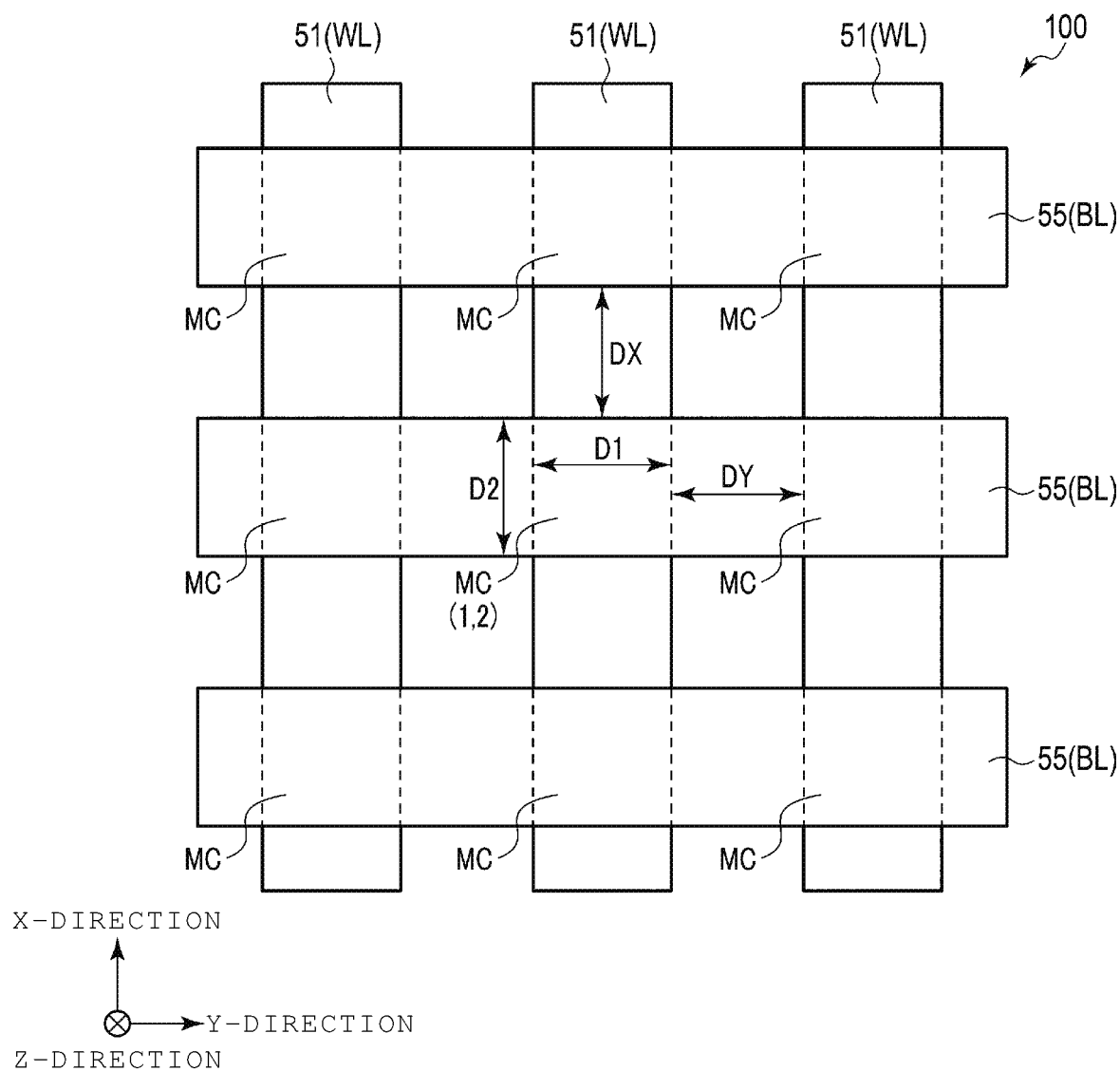
FIG. 18 depicts aspects of still another example application of a magnetic device of an embodiment.
Figure 19:
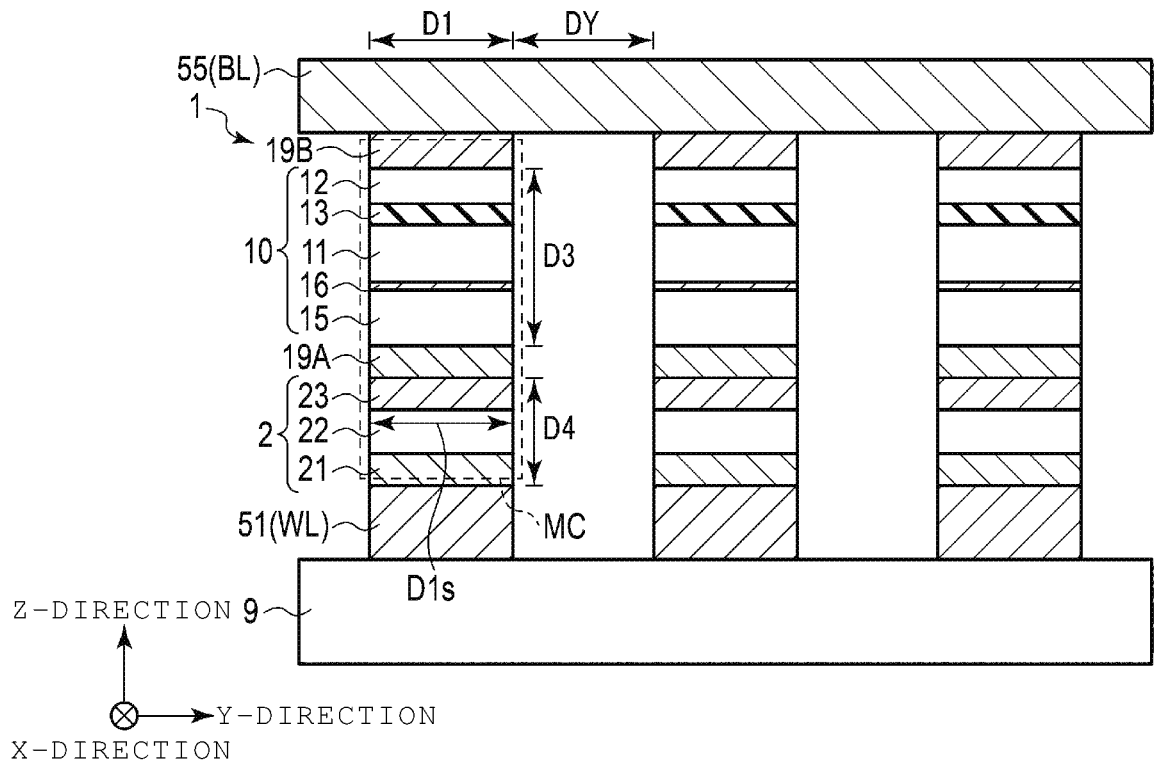
FIG. 19 depicts aspects of still another example application of a magnetic device of an embodiment.
Figure 20:
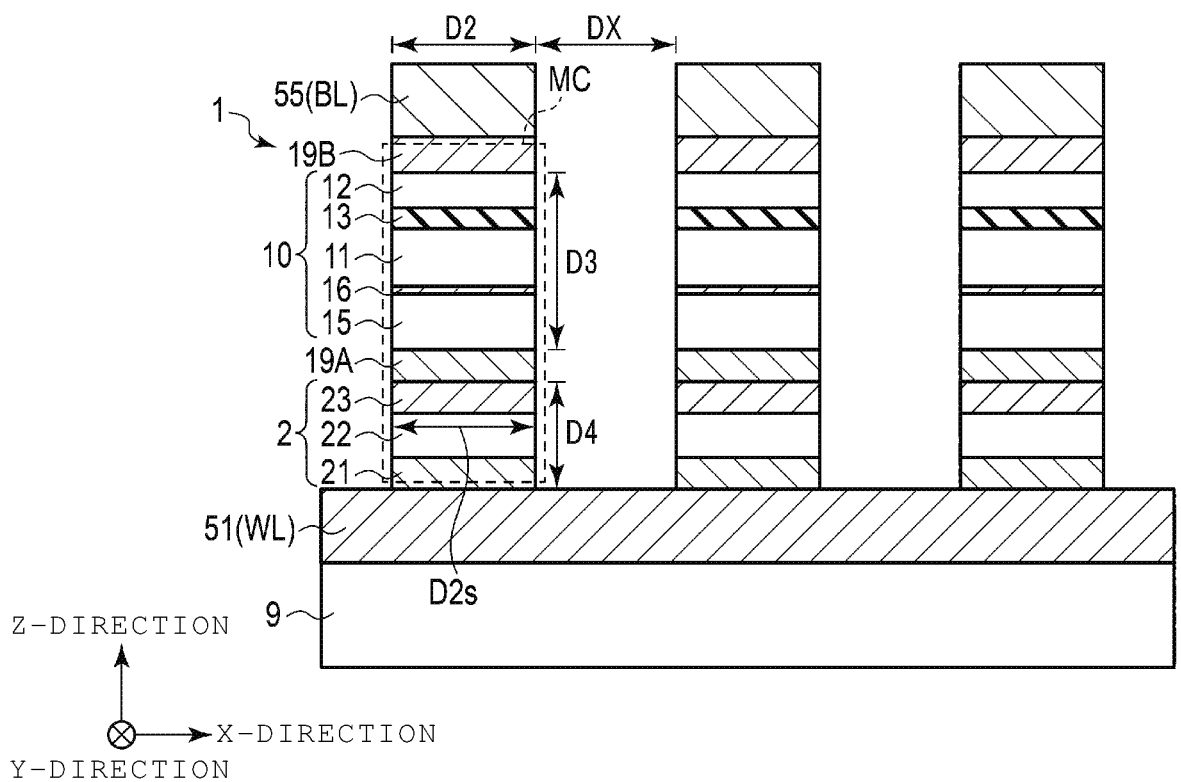
FIG. 20 depicts aspects of still another example application of a magnetic device of an embodiment.

FIGS. 18 to 20 are schematic views illustrating an example of the structure of memory cells in the MRAM according to this application example.

FIG. 18 is a top view. FIG. 19 illustrates a cross-sectional view along the Y-direction of FIG. 18. FIG. 20 illustrates a cross sectional view along the X-direction of FIG. 18.

As illustrated in FIGS. 18 to 20, each memory cell MC is a stacked body including a MTJ element 1 and a switching element 2. The MTJ element 1 is above the switching element 2 in the Z-direction.

The switching element 2 is a variable resistance element having two terminals. The switching element 2 includes two electrodes 21 and 23 and a resistance change layer 22. In the switching element 2, the electrode 21, the resistance change layer 22, and the electrode 23 are stacked in the Z-direction. The electrode 21 is provided on the upper surface of the wiring 51. The resistance change layer 22 is provided on the upper surface of the electrode 21. The electrode 23 is provided on the upper surface of the resistance change layer 22. As such, the resistance change layer 22 is provided between the two electrodes 21 and 23.

The MTJ element 1 includes, for example, the stacked body 10, the shift cancellation layer 15, and the metal layer 16.

The shift cancellation layer 15 is provided on the upper surface of the electrode 23. The stacked body 10 is provided on the upper surface of the shift cancellation layer 15 via the metal layer 16. An electrode 19B is provided on the upper surface of the stacked body 10.

The wiring 55 is provided on the upper surface of the electrode 19B.

In the memory cell, the material of the electrode 23 may be the same as the material of the lower electrode 19A of the MTJ element 1. In this case, the switching element 2 and the MTJ element 1 share an electrode between the switching element 2 and the MTJ element 1.

In this example, the memory cell MC has a quadrangular pillar structure.

The switching element 2 has a quadrangular planar shape. The switching element 2 also has a quadrangular cross-sectional shape in a cross section along the X-direction and a cross section along the Y-direction. In keeping with the various examples and embodiments described above, the planar shape of the MTJ element 1 is a quadrangle or a shape approximating the quadrangle.

The MTJ element 1 having a quadrangular planar shape has the dimension D1 along the X-direction and the dimension D2 along the Y-direction. For example, the dimension D2 is substantially the same as the dimension D1. The MTJ element 1 having a quadrangular planar shape has the stacked body 10 having the dimension D3 along the Z-direction. The dimension D3 of the MTJ element corresponds to a total height value including at least the shift cancellation layer 15, the metal layer 16, and the stacked body 10.

In the memory cell MC having a quadrangular pillar shape, for example, the switching element 2 has a dimension $D1s$ along the X-direction and a dimension $D2s$ along the Y-direction. Here, the dimension $D1s$ is substantially the same as the dimension D1. Likewise, the dimension $D2s$ is substantially the same as the dimension D2. The switching element 2 has a dimension D4 along the Z-direction. For example, the dimension D4 is 5 nm to 20 nm.

A distance DX between the memory cells MC adjacent to one another in the X-direction is equal to or greater than the dimension D1 and equal to or less than twice the dimension D1. A distance DY between the memory cells adjacent to one another in the Y-direction is equal to or greater than the dimension D2 and equal to or less than twice the dimension D2. The distance DX may be smaller than the dimension D1 or larger than twice the dimension D2. The distance DY may be smaller than the dimension D2 or larger than twice the dimension D2. The distance DX may be substantially the same as the distance DY or may be different from the distance DY.

In the MTJ element 1, at least one of the ratio D1/D3 and the ratio D2/D3 has a value of 0.10 to 4.0. More preferably, the ratio D1/D3 or the ratio D2/D3 is within a range of 0.28 to 2.5.

At least one of the dimension D1 and the dimension D2 is 5 nm to 40 nm. As a more preferable example, the dimension D1 or the dimension D2 is 14 nm to 25 nm. When at least one of the dimension D1 and the dimension D2 has a value in the range of 5 nm to 40 nm, the other may have a value smaller than 5 nm or larger than 40 nm in some cases.

The MTJ element 1 can have the effects described in conjunction with FIGS. 8 to 10. Accordingly, the MRAM including the MTJ element 1 can improve reliability of data.

5b. Manufacturing Method

With reference to FIG. 21 to FIG. 25, a manufacturing method of a memory device according to an embodiment will be described.

Each of FIG. 21 to FIG. 25 is a perspective view illustrating a manufacturing process of a memory cell array of a memory device described above as an application example.

Figure 21:
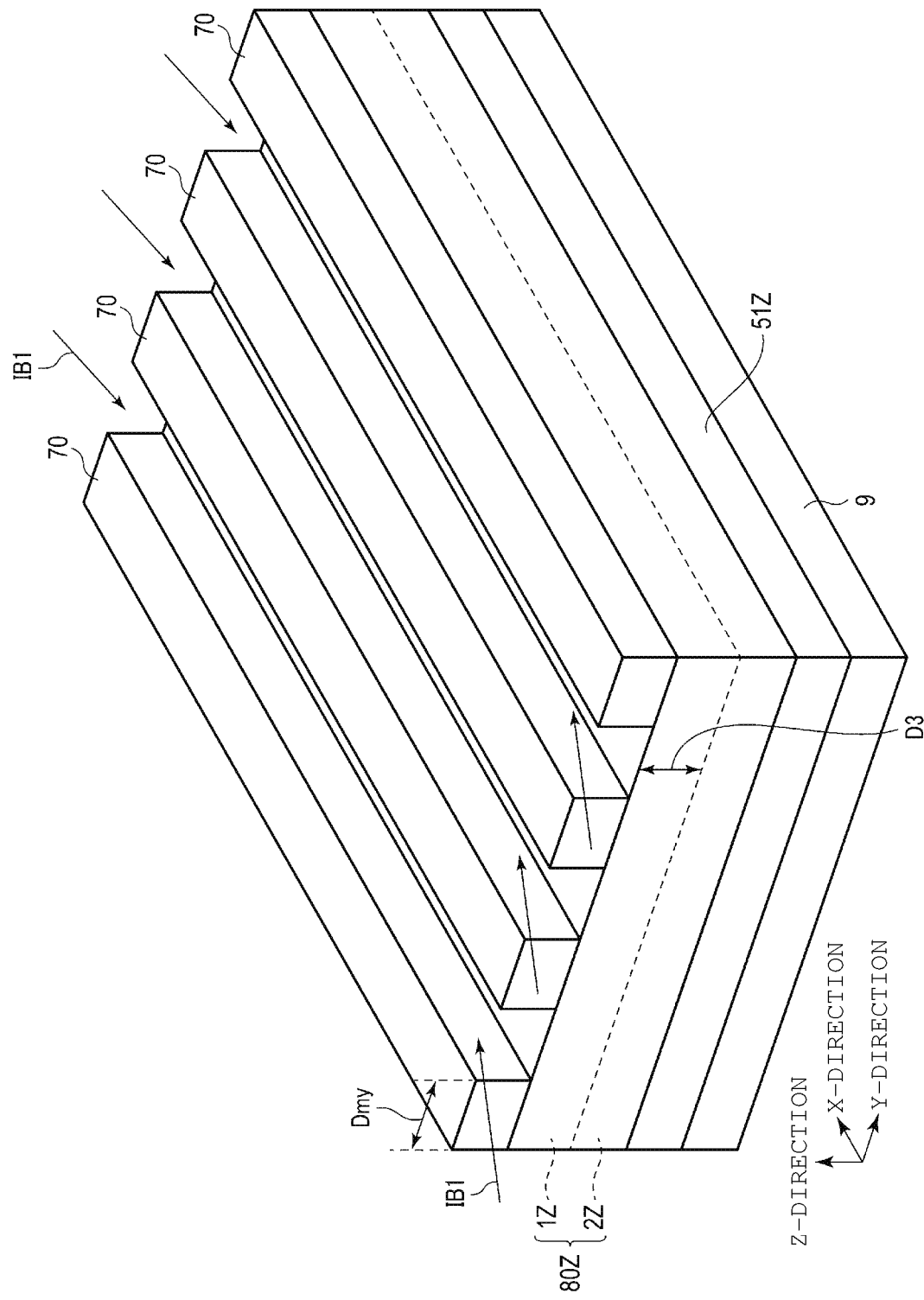
FIG. 21 depicts aspects of still another example application of a magnetic device of an embodiment.

As illustrated in FIG. 21, a conductive layer 51Z is formed on a substrate 9.

A stacked body 80 is formed on the conductive layer 51Z. The stacked body 80 includes layers used for forming a memory cell.

A layer 2Z for a switching element is formed on the conductive layer 51Z by using, for example, a film forming technique such as a sputtering method. A conductive layer is formed on the conductive layer 51Z. A resistance change layer is formed on the conductive layer. A conductive layer is formed on the resistance change layer.

The layer 1Z for the MTJ element is formed on the layer 2Z. For example, a magnetic layer is formed on the conductive layer. A non-magnetic layer (for example, a metal film such as a ruthenium film) is formed on the magnetic layer. A magnetic layer is formed on a non-magnetic layer. A non-magnetic layer (for example, an oxide layer containing magnesium (Mg)) is formed on the magnetic layer. A magnetic layer is formed on the non-magnetic layer. A conductive layer is formed on the magnetic layer.

The dimension D3 in the Z-direction of the layer 1Z has a value in the range of 10 nm to 50 nm.

For example, a thickness of the layer 2Z in the Z-direction has a value in the range of 5 nm to 20 nm.

After the stacked body 80 is formed on the conductive layer 51Z, a mask layer 70 is formed on the stacked body 80. The mask layer 70 formed by patterning by photolithography and etching. The mask layer 70 has a line-space pattern with lines extending in the X-direction.

For example, a dimension Dmy of the mask layer 70 in the Y-direction is set to a value within the range of 5 nm to 40 nm. The dimension Dmy may be set to a value of 14 nm to 25 nm in particular examples. For example, a distance between the mask layers 70 adjacent in the Y-direction is set to the dimension Dmy or more and two times or less the dimension Dmy.

Etching is performed on the conductive layer and the stacked body on the substrate 9. A stacked body 80Z and the conductive layer 51Z are processed based on the pattern of the mask layer 70. For example, an ion beam IB1 from an oblique direction with respect to the surface of the substrate 9 is used to remove unmasked portions of stacked body 80Z and the conductive layer 51Z.

Figure 22:
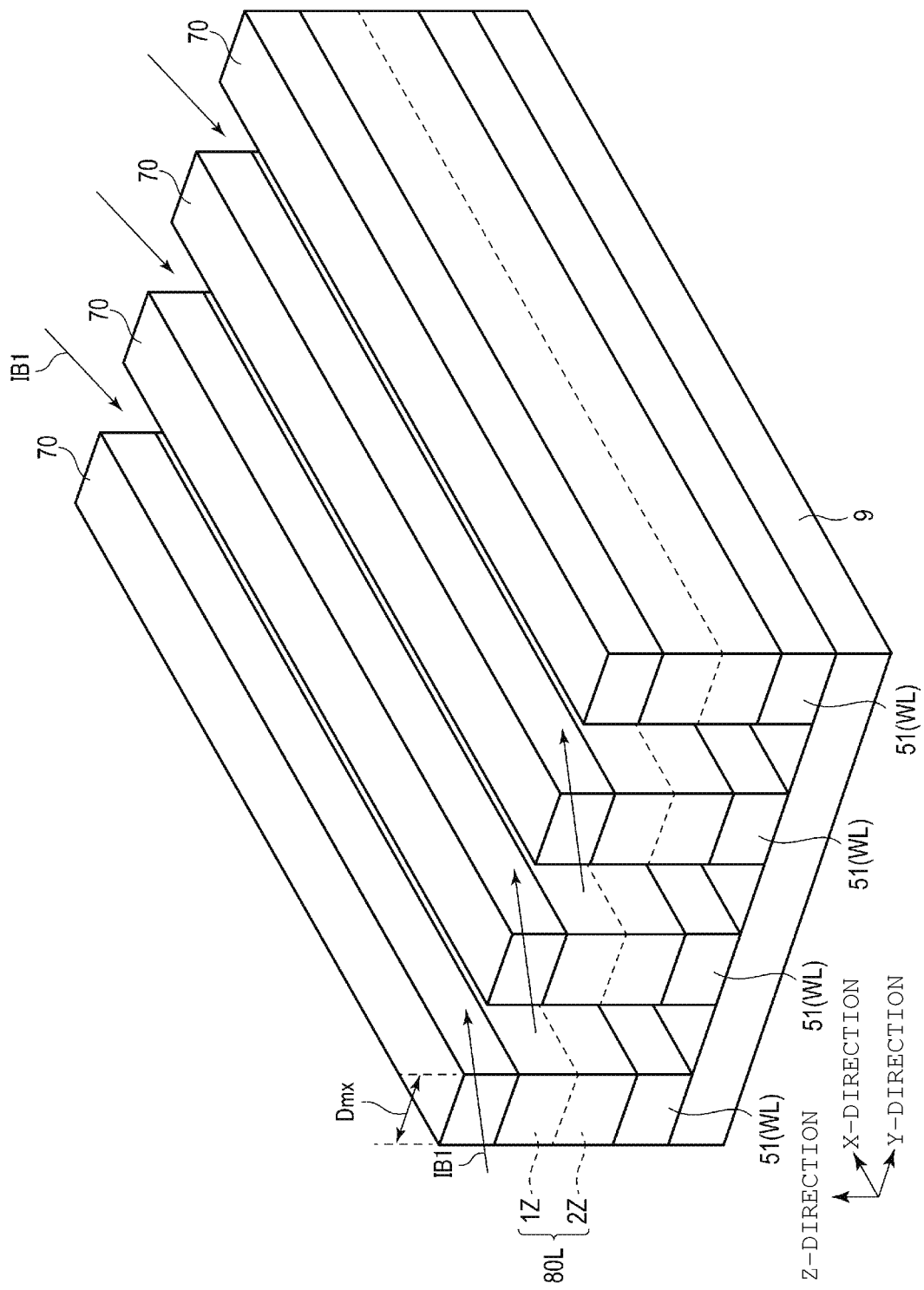
FIG. 22 depicts aspects of still another example application of a magnetic device of an embodiment.

Thus, as illustrated in FIG. 22, a stacked body 80L extending in the Y-direction and the conductive layer 51 extending in the Y-direction are formed on the substrate 9 so as to correspond to the pattern of the mask layer 70.

Figure 23:
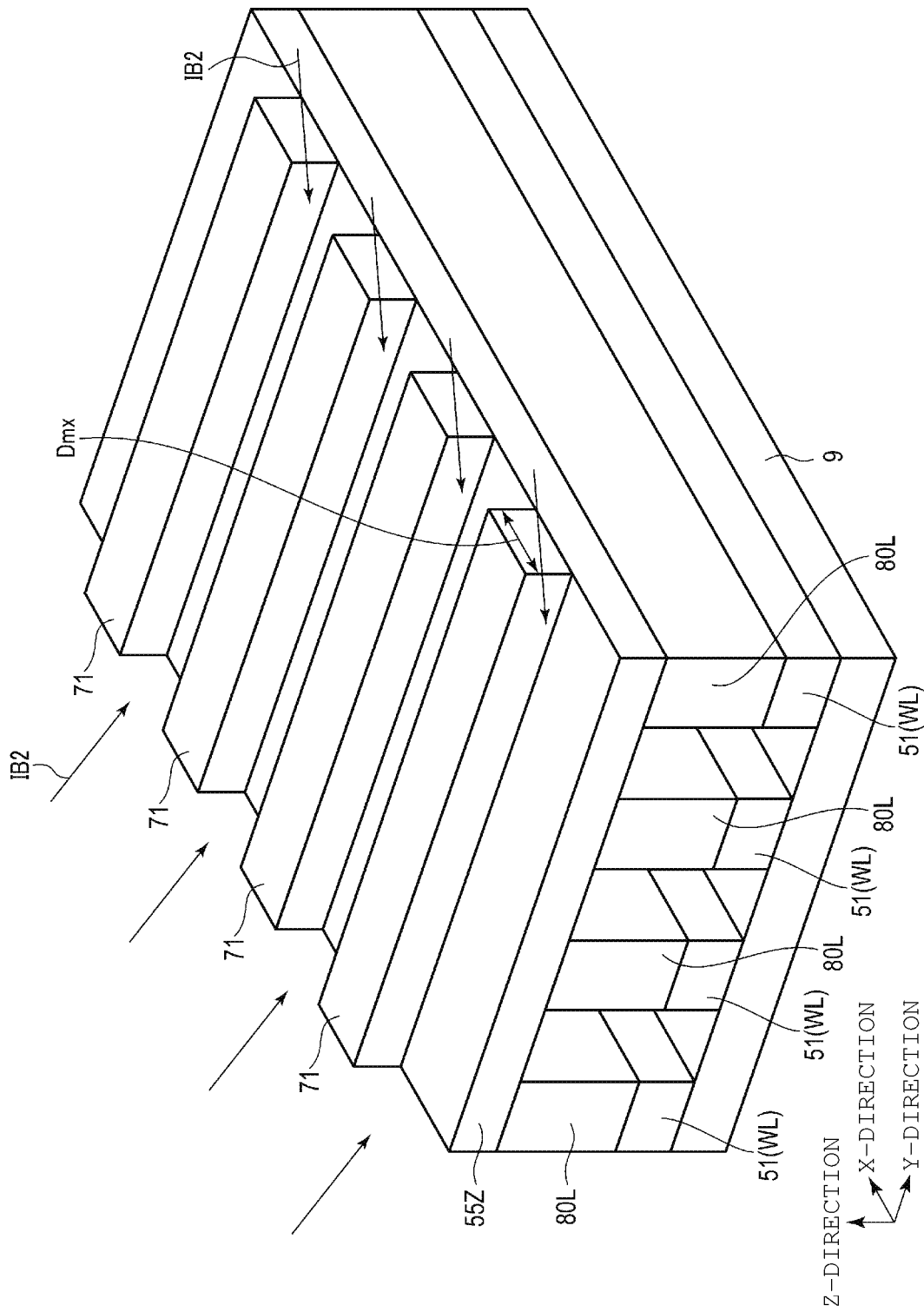
FIG. 23 depicts aspects of still another example application of a magnetic device of an embodiment.

As illustrated in FIG. 23, after the mask layer 70 is removed, an insulating layer (not specifically illustrated) is formed on the stacked body 80L, the conductive layer 51, and the substrate 9.

Thereafter, the upper surface of the insulating layer is polished flat by a CMP method using a portion (for example, a conductive layer) on the upper surface of the stacked body 80L as a stopper. Thus, the height of the upper surface of the insulating layer in the Z-direction substantially coincides with the height of the upper surface of the stacked body 80L. As a result, the insulating layer is embedded in the spaces between the conductive layers 51 and a between the stacked bodies 80L.

A conductive layer 55Z is formed on the stacked body 80L and the insulating layer. A mask layer 71 is then formed on the conductive layer 55Z.

The mask layer 71 is formed by photolithography and etching. The mask layer 71 has a line-space pattern with lines extending in the Y-direction. For example, a dimension Dmx in the X-direction of the mask layer 71 is set to a value within the range of 5 nm to 40 nm. In particular examples, the dimension Dmx is set to a value of 14 nm to 25 nm. For example, the dimension Dmx of the mask layer 71 in the X-direction is preferably set to be substantially the same as the dimension Dmy of the mask layer 70 in the Y-direction. For example, a distance between the mask layers 71 adjacent in the X-direction is set to the dimension Dmx or more and two times or less the dimension Dmx.

Etching using an ion beam IB2 is conducted on the stacked body 80L and the conductive layer 55Z.

Thus, the stacked body MC and the conductive layer 55 are processed based on the pattern of the mask layer 71. For example, the conductive layer 51 below the stacked body MC is used as an etching stopper.

For example, the ion beam IB2 from an oblique direction with respect to the surface of the substrate 9 is utilized.

Figure 24:
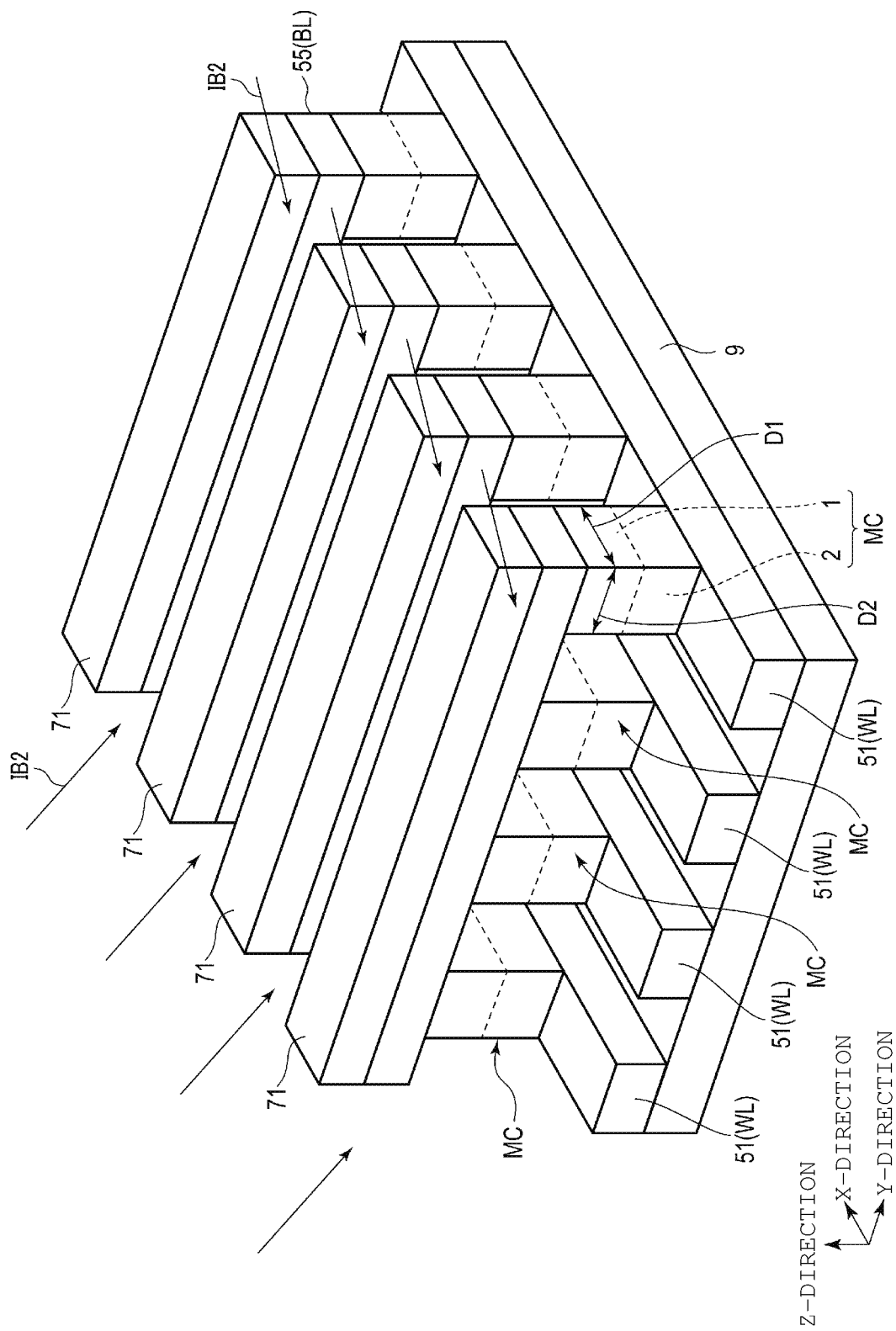
FIG. 24 depicts aspects of still another example application of a magnetic device of an embodiment.

Thus, as illustrated in FIG. 24, the conductive layer 55 extending in the X-direction is formed above the substrate 9 so as to correspond to the pattern of the mask layer 71. With this, the bit lines BL are formed.

By this etching, the stacked body 80L extending in the Y-direction before etching is divided into a plurality of portions in the X-direction. As a result, a memory cell MC having a quadrangular pillar is formed.

The MTJ element 1 in the memory cell MC has a quadrangular (for example, a square) planar shape. The dimension D1 in the X-direction of the MTJ element 1 has a value within the range of 5 nm to 40 nm. The dimension D2 in the Y-direction of the MTJ element 1 has a value in the range of 5 nm 40 nm. The dimension D3 in the Z-direction of the MTJ element 1 has a value within the range of 10 nm to 50 nm. Thus, the dimensional ratio D1/D3 in the MTJ element 1 has a value of 0.10 to 4.0.

As an example, at least one of the dimension D1 and the dimension D2 may have a value within the range of 14 nm to 25 nm.

As an example, the dimensional ratio D1/D3 may have a value within the range of 0.28 to 2.5.

The conductive layer 51 maintains a pattern extending in the Y-direction.

After the mask layer 71 is removed, an insulating layer (not specifically illustrated) is formed on the substrate 9, the memory cells MC, and the conductive layer 51. Thus, the insulating layer is embedded in the spaces between the memory cells MC and between the conductive layers 51.

As described above, an MRAM including the memory cell array described as FIG. 17 to FIG. 20 is formed.

When the substrate 9 is a semiconductor substrate (for example, a silicon substrate), before the memory cell array 100 is formed, a CMOS circuit or the like such as the row control circuit 110 and the column control circuit 120 may be formed on the semiconductor substrate 9. After an interlayer insulating film covering the thus formed CMOS circuit(s) is formed on the semiconductor substrate 9, the memory cell array can be formed using this interlayer insulating film as the substrate 9 by the same manufacturing process described with reference to FIGS. 21 to 24.

When the plurality of memory cells MC are provided at different heights in the Z-direction, the manufacturing processes of FIGS. 21 to 24 can be performed using a layer including previously formed memory cells MC as a substrate.

c. Summary

In this application example, a magneto-resistance effect element of the present disclosure is used as a memory element of a memory device.

The magneto-resistance effect element of this example has the quadrangular pillar structure.

The magneto-resistance effect element has a ratio D1/D3 of 0.10 to and 4.0. In a particular example, the ratio D1/D3 is within a range of 0 to 2.5.

For example, the dimension D1 is 5 nm to 40 nm or more preferably, 14 nm to 25 nm.

A memory device including a magneto-resistance effect element according to the present disclosure can improve reliability of data.

In described manufacturing process, a memory cell having the quadrangular pillar shape is formed by an ion beam supplied from a direction along the X-direction and an ion beam supplied from a direction along the Y-direction.

As such, the memory cell array can be formed by a process with a relatively low degree of processing difficulty. A memory cell array using a magneto-resistance effect element of the present disclosure can have improved storage density and/or reduced manufacturing cost.

6. Others

The magnetic device of the above embodiments and examples may be an in-plane magnetization type magneto-resistance effect element. In an in-plane magnetization type magneto-resistance effect element (for example, an MTJ element), each magnetic layer has in-plane magnetic anisotropy. The direction of an axis of easy magnetization of each magnetic layer is parallel to the layer surface of the magnetic layer. Each magnetic layer has magnetization parallel to the layer surface. The direction of magnetization of each magnetic layer is perpendicular to the lamination direction of the magnetic layers.

In the embodiments and examples described above, a magneto-resistance effect element is applied to a memory device (for example, an MRAM). However, the magnetic device may be a magnetic head of a hard disk drive (HDD), a magnetic sensor, or the like.

A write operation of the STT method was used as an example. However, a write operation of the spin orbit torque (SOT) method may be applied the above described embodiments.

The configuration of the memory cells and the memory cell arrays is not limited to the examples of FIGS. 15 to 20.

For example, a memory cell having a field effect transistor may be used. The field effect transistor or cell transistor can function as a switching element of the memory cell. The memory cells are connected to a word line and two bit lines forming a bit line pair. One end of a current path of the cell transistor is connected to a first bit line of the bit line pair, the other end of the current path of the cell transistor is connected to one end of the magneto-resistance effect element, and the other end of the magneto-resistance effect element is connected to a second bit line (source line) of the pair. A gate of the cell transistor is connected to the word line.

In these cases, the magneto-resistance effect element having a quadrangular planar shape can obtain the effects described above as long as it has the dimensions and the dimensional ratio described above in conjunction with example embodiments.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of this embodiments described herein may be made without departing from the spirit of the present disclosure. The accompanying claims and their equivalents are intended to cover such forms or modifications as would fall within the scope and spirit of the present disclosure.

What is claimed is:

1. A magnetic device, comprising:
a substrate having a surface; and
a stacked body on the surface of the substrate and including a first magnetic layer, a second magnetic layer, a third magnetic layer, a metal layer, and a non-magnetic layer, the metal layer being between the second magnetic layer and the third magnetic layer, and the non-magnetic layer being between the first magnetic layer and the second magnetic layer, wherein
the stacked body has a quadrangular planar shape,
the stacked body has a first side dimension in a first direction parallel to the surface of the substrate and a thickness in a second direction orthogonal to the surface of the substrate, and
a ratio of the first side dimension to the thickness is in a range of 0.10 to 4.0.

2. The magnetic device according to claim 1, wherein the first side dimension is in a range of 5 nm to 40 nm.

3. The magnetic device according to claim 2, wherein the stacked body is a square pillar shape.

4. The magnetic device according to claim 2, wherein the stacked body is a rectangular pillar shape with a second side dimension greater than the first side dimension.

5. The magnetic device according to claim 2, wherein the quadrangular planar shape includes rounded corner portions.

6. The magnetic device according to claim 2, wherein the quadrangular planar shape includes chamfered corner portions.

7. The magnetic device according to claim 1, wherein the stacked body is a square pillar shape.

8. The magnetic device according to claim 1, wherein the stacked body is a rectangular pillar shape with a second side dimension greater than the first side dimension.

9. The magnetic device according to claim 1, wherein the quadrangular planar shape includes rounded corner portions.

10. The magnetic device according to claim 1, wherein the quadrangular planar shape includes chamfered corner portions.

11. The magnetic device according to claim 1, wherein the ratio is in a range of 0.28 to 2.5.

12. The magnetic device according to claim 1, wherein the stacked body is a magneto-resistance effect element and is electrically connected between a word line and a bit line.

13. A memory device, comprising:
a first wiring extending in a first direction parallel to a surface of a substrate;
a second wiring extending in a second direction parallel to the surface of the substrate and intersecting the first direction; and
a memory cell between the first wiring and the second wiring, the memory cell including a magneto-resistance effect element having a first magnetic layer, a second magnetic layer, and a non-magnetic layer between the first magnetic layer and the second magnetic layer, wherein
the magneto-resistance effect element has a quadrangular planar shape,
the magneto-resistance effect element has a first side dimension in the first direction and a thickness in a third direction orthogonal to the surface of the substrate,
a ratio of the first side dimension to the thickness is in a range of 0.10 to 4.0,
the memory cell further includes a switching element including a first electrode, a second electrode, and a resistance change film between the first electrode and the second electrode,
the switching element is aligned with the magneto-resistance effect element in the third direction, and
the switching element has a quadrangular planar shape matching the quadrangular planar shape of the magneto-resistance effect element.

14. The memory device according to claim 13, wherein the first side dimension is in a range of 5 nm to 40 nm.

15. The memory device according to claim 13, wherein the magneto-resistance effect element is a square pillar shape.

16. The memory device according to claim 13, wherein the magneto-resistance effect element further includes:
a third magnetic layer, and
a metal layer between the second magnetic layer and the third magnetic layer.

17. A memory device, comprising:
a first wiring extending in a first direction parallel to a surface of a substrate;
a second wiring extending in a second direction parallel to the surface of the substrate and intersecting the first direction; and
a memory cell between the first wiring and the second wiring, the memory cell including a magneto-resistance effect element having a first magnetic layer, a second magnetic layer, and a non-magnetic layer between the first magnetic layer and the second magnetic layer, wherein
the magneto-resistance effect element has a quadrangular planar shape,
the magneto-resistance effect element has a first side dimension in the first direction and a thickness in a third direction orthogonal to the surface of the substrate, and
the magneto-resistance effect element further includes:
a third magnetic layer, and
a metal layer between the second magnetic layer and the third magnetic layer.

18. The memory device according to claim 17, wherein the first side dimension is in a range of 5 nm to 40 nm.

19. The memory device according to claim 17, wherein the magneto-resistance effect element is a square pillar shape.

* * * * *